United States Patent
Matthews et al.

(10) Patent No.: US 7,999,710 B2
(45) Date of Patent: Aug. 16, 2011

(54) MULTISTAGE CHOPPER STABILIZED DELTA-SIGMA ADC WITH REDUCED OFFSET

(75) Inventors: Wallace Edward Matthews, Austin, TX (US); Bertan Bakkaloglu, Scottsdale, AZ (US); Brian Phillip Lum-Shue-Chan, Palm Bay, FL (US)

(73) Assignee: Texas Instruments Incorporated, Dallas, TX (US)

( * ) Notice: Subject to any disclaimer, the term of this patent is extended or adjusted under 35 U.S.C. 154(b) by 100 days.

(21) Appl. No.: 12/560,096

(22) Filed: Sep. 15, 2009

(65) Prior Publication Data
US 2011/0063146 A1 Mar. 17, 2011

(51) Int. Cl.
*H03M 3/00* (2006.01)
(52) U.S. Cl. ........................................................ 341/143
(58) Field of Classification Search .................. 341/143
See application file for complete search history.

(56) References Cited

U.S. PATENT DOCUMENTS

| | | | |
|---|---|---|---|
| 4,994,804 A * | 2/1991 | Sakaguchi | 341/143 |
| 4,994,805 A * | 2/1991 | Dedic et al. | 341/143 |
| 5,477,481 A * | 12/1995 | Kerth | 708/819 |
| 6,404,367 B1 * | 6/2002 | Van der Zwan et al. | 341/143 |
| 6,476,671 B1 | 11/2002 | Tang | |
| 6,639,532 B1 * | 10/2003 | Liu et al. | 341/143 |
| 2003/0146786 A1 * | 8/2003 | Gulati et al. | 330/9 |
| 2009/0079607 A1 * | 3/2009 | Denison et al. | 341/143 |

OTHER PUBLICATIONS

H. Kim & B. Bakkaloglu; An 0.18μm CMOS Electrochemical Sensor Readout IC for Exhaust Gas Monitoring; Research in Microelectronics and Electronics, 2009. Prime 2009; Jul. 12-17, 2009, pp. 324-327; Print ISBN 978-1-4244-3733-7; INSPEC Accession No. 10840576.*
Analog Devices, AN-609 Application Note, "Chopping on Σ-Δ ADCs", Adrian Sherry, 2003.
Texas Instruments, ADS1672, "625kSPS, 24-Bit Analog-to-Digital Converter", Jun. 2008.

* cited by examiner

*Primary Examiner* — Howard Williams
(74) *Attorney, Agent, or Firm* — John J. Patti; Wade J. Brady, III; Frederick J. Telecky, Jr.

(57) ABSTRACT

A relatively low frequency chopping operation is applied to a delta-sigma ADC to reduce DC offsets resulting from non-ideal component operation. Sequential chopping takes place outside a closed loop and may include an inverted polarity feedback for a part of the chopping period. Nested chopping involves chopping within the closed loop, and may include an inverted polarity feedback and a time shift. The feedback compensation for sequential and nested chopping permits the correct polarity feedback to be provided at the desired time in conjunction with sampling and quantization events. Integrating capacitor(s) may be swapped in relative polarity during nested chopping to preserve residual conversion information for the desired polarity. The ADC operation is non-temperature dependent and avoids modification to the useful signal, resulting in higher accuracy.

37 Claims, 15 Drawing Sheets

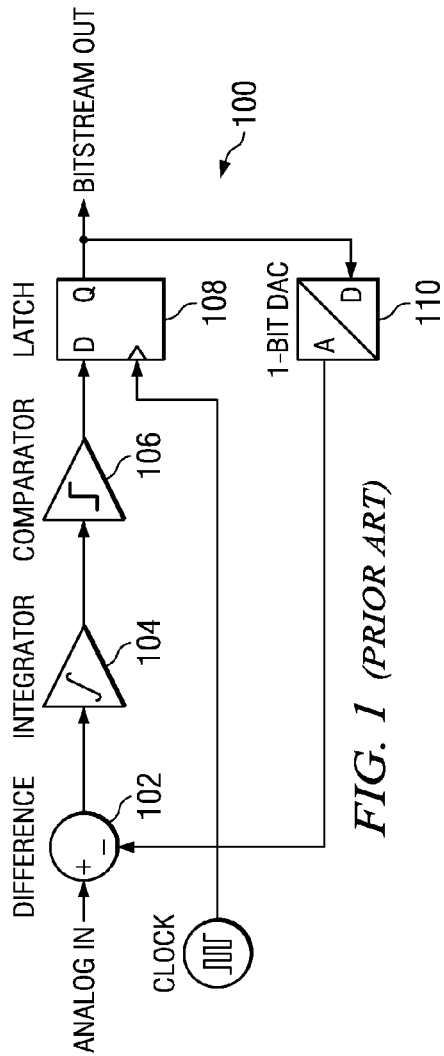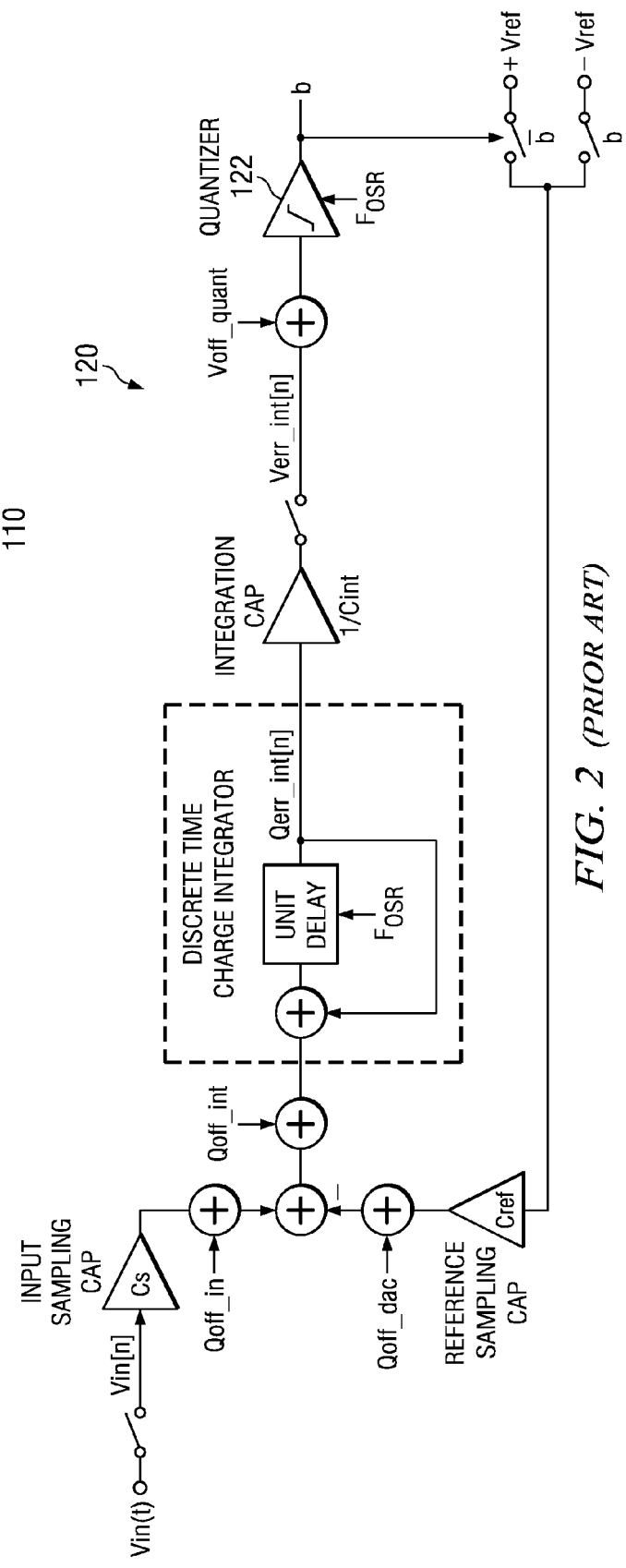
*FIG. 1 (PRIOR ART)*
*FIG. 2 (PRIOR ART)*

MULTISTAGE CHOPPER STABILIZED DELTA-SIGMA ADC WITH REDUCED OFFSET

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

The present disclosure relates generally to analog-to-digital converters (ADCs), and more particularly to delta-sigma ($\Delta\Sigma$) ADCs with reduced DC offset and reduced low frequency noise.

A delta-sigma ($\Delta\Sigma$) ADC is similar to a voltage controlled oscillator in which the frequency of the oscillation is proportional to the input voltage. A $\Delta\Sigma$ ADC is typically realized with a $\Delta\Sigma$ modulator, such as is represented in FIG. 1. A $\Delta\Sigma$ modulator 100 operates on an analog input to a difference operator 102, such as may be implemented as a summing junction. An integrator 104 operates on the error signal produced by difference operator 102. A comparator 106 provides a threshold operation in which the output of integrator 104 is compared to a threshold, and an output of comparator 106 changes state when the threshold is crossed. A latch 108, which can be implemented as a D flip-flop, captures the output of comparator 106 and produces a bit stream output. A feedback loop is provided through a one bit digital-to-analog converter (DAC) 110. The output of DAC 110 is provided to difference operator 102 to produce the error signal applied to integrator 104. The bit stream produced by delta-sigma modulator 100 is used to provide an analog-to-digital conversion when the bit stream output pulses are counted within a given time interval. When the pulses output from latch 106 are counted or summed over a given interval, the digitized value of the count or sum represents an average of the analog input. Feedback DAC 110 typically converts a bit stream value output from latch 108 to a voltage reference that can represent a range of operation for the delta-sigma modulator. Comparator 106 and latch 108, when combined, can be viewed as providing a quantization operation.

When delta-sigma modulators are used to convert analog inputs to a bit stream output for use in ADC applications, such a $\Delta\Sigma$ ADC may be limited in the dynamic range and the acceptable frequency of the analog input. The accuracy of high dynamic range DC and low frequency measurement signal chains in a $\Delta\Sigma$ ADC are dominated by DC offset and 1/f noise. The input and signal chains in a $\Delta\Sigma$ ADC are typically implemented as differential pathways to contribute to rejecting or reducing noise.

Auto-zeroing and chopping are two fundamental approaches conventionally used to minimize DC offset and low frequency noise in data converters and sampled amplifiers. Auto-zeroing refers to a technique for reducing the impact of DC offsets associated with ADC operation by measuring and attempting to cancel offsets. In one approach, ADC inputs are shorted and the DC, input-referred, offset is measured, stored and subtracted from input values during regular operation. This approach is limited by the accuracy of measuring the offset and residual errors during the cancellation of the offset.

Chopping refers to a technique for switching signal pathways in an attempt to compensate for the impact of pathway mismatches. Signal pathway mismatches may be related to component tolerances, manufacturing processes, trace paths and other mismatched items that can produce voltage offsets in the signal pathways. Chopping helps to remove the offsets by alternating signal pathways to balance mismatch impact over time.

However, notwithstanding the above techniques, a residual DC offset continues to be present due to mismatches in the differential signal paths. Achieving an input referred offset in the range of 100 nV is a major challenge in high accuracy DC measurement circuits.

Referring to FIG. 2, a diagram of a charge domain model of a typical first order ADC system 120 that is based on a $\Delta\Sigma$ modulator, such as that illustrated in FIG. 1, is illustrated. System 120 illustrates the charge domain operation of the first order $\Delta\Sigma$ ADC that shows offset sources associated with integrators and switches. System 120 illustrates an input sampling capacitor Cs, a feedback sampling capacitance Cref, an integration and amplification capacitance Cint and a quantizer 122. The offset charge associated with each of these signal paths are illustrated as Qoff_in across input sampling capacitance Cs, Qoff_dac across feedback capacitance Cref, Qoff_int associated with the integrator, and offset Voff_quant associated with quantizer 122. The input referred offsets associated with the sources modeled and reflected to the input in system 120 are summarized in Equation 1 below.

$$V_{off\_tot} = \frac{Q_{off\_in}}{Cs} + \frac{Q_{off\_dac}}{Cs} + \frac{Q_{off\_int}}{Cs} + V_{off\_quant} \cdot (1 - z^{-1}) + V_{off\_int} \quad (1)$$

Equation 1 indicates that offsets associated with the input and the feedback DAC, as well as the amplifiers, refers to the ADC input as is, and therefore a reduction in the amplifier offset and 1/f noise contribution is insufficient to reduce the input offset.

In known ADCs, attempts have been made to remove DC offsets by focusing on amplifier offsets and 1/f noise. One approach to reduce or remove DC offsets calls for the introduction of a chopping operation as described above. With this approach, a signal path is modulated and demodulated with switches or pulse signals to chop the signal. The chopping operation can contribute to reducing DC offsets and low frequency noise in an integrator/amplifier. These approaches, however, do not address residual errors that originate from the chopping activity itself.

One known attempt to reduce DC offsets and 1/f noise associated with switched capacitor gain stages, as well as $\Delta\Sigma$ ADCs, employs a fast chopping switch before and after the integrator, which tends to move the low frequency errors to higher frequencies and permits the useful signal to pass unchanged.

Referring now to FIG. 3, a block diagram of a conventional chopped integrator used with a $\Delta\Sigma$ ADC is illustrated as system 130. An operational trans-conductance amplifier (OTA) 132 with a gain of gme has an input chopper 134 and an output chopper 135. Input and output choppers 134, 135 move 1/f noise and DC offsets of OTA 132 to a higher frequency. For example, a DC offset of OTA 132, represented as voltage Voff_amp is moved to a higher frequency by choosing a chopping frequency, fchop_fast, which moves 1/f noise away from the useful signal.

Sampling switches 136, 138 and feedback DAC switches 137a, 137b have a charge injection that is common mode if the switches are ideally matched. Sampling switches 138 are referenced to a common mode voltage Vcm to provide common mode sampling in an arrangement sometimes referred to as parasitic insensitive sampling. However, mismatches in the paths and switch variables tend to produce a DC offset voltage Voff_int, which is temperature dependent. As indicated in FIG. 3, the accumulated DC offset Voff_int equals the sum of the DC offset Voff_samp from sampling switches 136 and the DC offset Voff_dac from the feedback DAC switches 137a, 137b. DC offset Voff_dac can also be influenced by mismatches in feedback capacitors 133a, 133b. The DC offset represented by voltage Voff_dac can be dynamic based on the density of the logic ones produced by the ADC provided in the DAC feedback. The dynamic nature of voltage Voff_dac can be further influenced by mismatches in the DAC switches. The DC offset due to a high logic one density in the output of the ADC tends to decrease for analog inputs around midrange of the ADC. Switch leakage mismatch, both junction and off-state, also contributes to offset errors.

FIG. 4 illustrates a system block diagram of a charge domain model of a ΔΣ ADC using a chopped integrator such as that shown in FIG. 3. A shortcoming of the technique of using a fast chopping clock before and after the integrator, as illustrated in FIG. 4, is that charge injection mismatches due to input and feedback switches of the ADC continue to remain a dominant offset source.

FIG. 5 illustrates another known attempt to reduce DC offset and 1/f noise to push the input signal to a high frequency using an input chopping network. The high pass quantization noise generated by a typical ΔΣ ADC can contaminate the input signal in accordance with this approach. The contamination can be reduced by converting the low pass ΔΣ modulator to a high pass modulator using the low pass-to-high pass frequency transformation z→-z. This is the approach is illustrated in the system block diagram shown in FIG. 5. In the modulator illustrated in FIG. 5, unlike previous ΔΣ ADCs, the quantization noise is pushed to lower frequencies. However, due to primary modulation at the input, the useful signal is pushed to higher frequencies, generating stringent settling time and slew rate requirements on the analog modulator, which tends to increase overall power consumption for the ADC. In addition, residual offset due to the fast chopping activity at the input continues to present a problem with inaccuracy in this architecture.

Another known approach to address DC offsets is similar to that described above in FIG. 5, with the addition of a slow chopper to remove residual DC offset. FIG. 6 illustrates a charge domain model with an ADC incorporating a slow chopper. The ADC of FIG. 6 has the drawback that a slow changing input is processed to a very high frequency, which tends to increase the analog modulator settling and slew rate requirements. In addition, moving the input signal to a higher frequency tends to cause a disturbance on the integration capacitor. The disturbance on the integration capacitor reduces the DC accuracy of the ADC, which in turn contributes to a reduction in the overall accuracy of the ADC. The ADC charge domain model exhibits a lack of phase inversion in the feedback DAC, which makes this approach less useful in terms of limitations on DC accuracy and dynamic range.

BRIEF SUMMARY OF THE INVENTION

The disclosed systems and methods provide a ΔΣ (delta-sigma) analog-to-digital converter (ADC) that reduces DC offsets and 1/f noise by providing a secondary, relatively low frequency chopping component. A multi-stage approach uses both relatively low and relatively high chopping frequencies to reduce the impact of residual errors due to chopping clock paths. The addition of a relatively low frequency chopping clock in conjunction with a typical chopping clock associated with an integrator/amplifier pushes the residual offsets associated with the input sampling network to an offset frequency to reduce or remove the impact of the offsets on the useful signal. Input referred offsets of differential switched capacitor networks increase with parasitic capacitance mismatches, due to channel charge injection and clock feed-through mismatches. The relatively slow chopping frequency reduces the impact of the sampling network mismatch effects, as well as reducing post-chopping residual offset from the integrating amplifier.

According to one embodiment of the disclosed system and method, a series switch is provided before the sampling network of the ΔΣ ADC, where the switch is clocked at a relatively slow speed, which up-converts the input signal to a relatively low intermediate frequency. After the sampling operation, a demodulator down-converts the signal to DC, up-converting the residual DC offsets to a higher frequency. Because the series switch operates sequentially in the signal chain, the error signal in a feedback loop filter of the ADC is undisturbed, which avoids any reduction in accuracy.

According to another exemplary embodiment of the disclosed system and method, a series switch is provided before the sampling network of the ΔΣ ADC, which switch is clocked at a relatively slow speed, up-converting the input signal to a relatively low intermediate frequency. The integrator operates on the chopped signal, and the output of the integrator is demodulated back to DC. The final signal after the integrator has the same frequency location and polarity as the original signal to be provided to a quantizer.

According to another exemplary embodiment of the disclosed system and method, a series switch is provided before the sampling network of the ΔΣ ADC, where the switch is clocked at a relatively low speed. After the sampling network, a demodulator down-converts the signal, prior to the signal being applied to the closed loop of the ΔΣ ADC. The charge injection errors due to the feedback loop, as well as the DAC, are outside of the relatively slow switching nest. In addition, because the switch operates sequentially in the signal chain, the error signal in the feedback loop of the ADC is undisturbed, which avoids any reduction in accuracy.

According to another embodiment of the disclosed system and method, a series switch is provided before the sampling network of the ΔΣ ADC, and clocked at a relatively low frequency, up-converting the input signal to a relatively low intermediate frequency. A demodulator, also operating at the relatively slow speed, is positioned in the forward path of the closed loop ΔΣ ADC, within the closed loop arrangement. Charge injection errors due to feedback in the closed loop, related to a feedback DAC, are also within the slow chopping nest provided by the relatively slow switching speed of the series switch modulator and demodulator. The offsets due to the feedback loop switching, such as caused by the feedback DAC, are chopped as well, because of the error signal being placed within the slow chopping nest.

According to another exemplary embodiment of the disclosed system and method, a relatively slowly clocked series switch is provided before the sampling network of the ΔΣ ADC. The up-converted input signal is placed at a relatively low intermediate frequency, and demodulated at the output of the chopped integrator, in the forward path of the closed loop, and within the loop of the closed loop arrangement. The charge injection errors due to feedback, such as from the feedback DAC, are inside the slow chopping nest. The offsets due to the feedback, such as the feedback DAC, are chopped as well.

According to an exemplary embodiment of the disclosed system and method, the integrating capacitors associated with the chopped integrating amplifier are switched to compensate for polarity shifts in the slow chopped feedback. The integrating amplifier capacitors store a residual charge from the analog to digital conversion, which charge can be applied to a later conversion to improve accuracy. The polarity of the stored charge is changed when applied to a later conversion that also has a changed polarity, so that the polarity of the stored charge corresponds to the associated conversion.

According to an exemplary embodiment of the disclosed system and method, a $\Delta\Sigma$ ADC has differential input signals and can be provided with a first polarity inversion switch consisting of cross coupled switches arranged prior to a sampling network to perform a polarity inversion of the differential input signals. The switch can be operated at a low frequency to perform a chopping operation. A second polarity inversion switch consisting of cross coupled switches can be provided after the sampling network and before the feedback loop to perform a polarity inversion of the differential signals provided by the sampling network. The first and second polarity inversion switches can each be selectively enabled to perform chopping modulation and demodulation according to a sequential chopping configuration.

According to another exemplary embodiment of the disclosed system and method, a $\Delta\Sigma$ ADC has differential input signals and can be provided with a first polarity inversion switch consisting of cross coupled switches arranged prior to a sampling network to perform a polarity inversion of the differential input signals. The switch can be operated at a low frequency to perform a chopping operation. A second polarity inversion switch consisting of cross coupled switches can be provided after a comparator in the $\Delta\Sigma$ ADC to perform a polarity inversion of the differential signals provided by the comparator. The first and second polarity inversion switches can each be selectively enabled to perform chopping modulation and demodulation according to a nested chopping configuration.

The above-described exemplary nested chopping configuration has a polarity inversion switch inside the feedback loop of the $\Delta\Sigma$ ADC. According to an exemplary embodiment of the disclosed system and method, when the polarity of the input to the amplifier is switched, the amplifier integrating feedback is also switched. The comparator can make a logic decision, zero (0) or one (1) for example, based on a given polarity, and if the polarity changes, the feedback can also be changed to match the appropriate polarity. The comparator may make a decision based on prior information provided by the integrating capacitors. The capacitors can be changed, or swapped, between the differential amplifier inputs, to apply the desired information to the desired differential inputs to match the decision time frame and feedback information.

A nested chopping configuration may have logic that appropriately conditions the digital to analog converter (DAC) feedback. The DAC feedback may be influenced by the slow chopping operation in the nested configuration, such as by having a polarity change. The logic for the feedback operates to obtain a polarity that is appropriate to the polarity of the output of the comparator when the comparator decision is made. For example, the first feedback bit after a nested chopped clock edge is inverted to accommodate the chopped integrating capacitors, which are chopped prior to the application of the delayed feedback.

According to another exemplary embodiment of the disclosed system and method, a sequential chopping configuration is combined with a nested chopping configuration, and either or neither configuration is selectively enabled. A first polarity inversion switch consisting of cross coupled switches is arranged prior to a sampling network and selectively enabled to provide a relatively slow chopping operation on the input voltage in either sequential or nested configurations. A sequential polarity inversion switch is located after the sampling network and before the integrating amplifier, and selectively enabled to demodulate the relatively slow chopping provided by the first polarity inversion switch. A nested polarity inversion switch is located within the feedback loop after the comparator, and selectively enabled to demodulate the relatively slow chopping provided by the first polarity inversion switch.

Polarity inversion switches are also located on either side of each integrating capacitor provided in the integrating amplifier. The polarity inversion switches for the integrating capacitors are selectively enabled to be switched in conjunction with the nested polarity inversion switch to provide selectively enabled nested chopping. Logic circuitry to control a feedback bit after a nested chop clock edge is selectively enabled. The logic circuitry may, for example, invert the feedback bit a clock period from the nested clock when nested chopping is enabled. With this combination of selectively enabled sequential or nested chopping, a $\Delta\Sigma$ ADC can be implemented that can be configured to have sequential chopping, nested chopping, or neither, in accordance with a given application, for example. Alternatively, or in addition, another selectively enabled polarity inversion switch can be implemented at an input stage of the $\Delta\Sigma$ ADC, and operated in conjunction with a sequential or nested chopping switch. With such an implementation, either sequential or nested chopping may be realized.

According to an advantageous aspect, the disclosed system and method avoids digitizing the input signal with the $\Delta\Sigma$ ADC at an offset frequency. The slow chopping activity is transparent to the integrator(s) inside the loop filter, thereby avoiding impact to the useful signal. The signal does not suffer from signal-to-noise ratio (SNR) and DC accuracy degradation due to shifting of useful signals to offset frequencies.

According to another advantage, the disclosed system and method avoids the modification or addition of any digital signal post processing. The digital decimation filters that follow the $\Delta\Sigma$ ADC need not be modified to be used with the disclosed system and method.

According to another advantage, the disclosed system and method provides temperature independence, so that offset removal is consistent across a wide variety of operating temperatures. The residual offsets due to sampling and feedback switching are removed dynamically, so that the accuracy of the compensation process is maintained independent of the operating temperature.

According to another advantage, the disclosed system and method permit enablement or disablement of the low frequency switching with no impact to normal operation. By positioning the low frequency switches at specific, low criticality points in the modulator, they can be set to a static on or off position without influencing normal operation of the ADC.

According to another exemplary embodiment of the disclosed system and method, the slow chopped ADC is configured to account for ambient and systemic noise. The slow chopped ADC is adjusted for synchronous or harmonic noise related to the slow chopping clock. The slow chopping clock is configured to have transition edges that are placed in time instances to minimize overall system noise. For example, if there is a known periodic digital noise source in the system, such may be provided by a DSP, a decimation filter or a CPU, the slow-chopping clock can be selected to be harmonically isolated in relation to the noise sources. A processor may be used to perform a periodic conversion, which can result in an activity dependent voltage offset applied to components of the ΔΣ ADC. Advantageously, the phases of the chopping clock are arranged to coincide with and chop synchronous noise sources, or to avoid and not chop intervals of noise from synchronous noise sources. For example, the conversion activity by the processor may be high at times and low at others, so the phases of the chopping clock are arranged to chop the greater incident noise, or to chop the converter signals during intervals of lesser incident noise, to decrease specific synchronous noise impact on the system.

BRIEF DESCRIPTION OF THE SEVERAL VIEWS OF THE DRAWINGS

The disclosed system and method are described in greater detail below, with reference to the accompanying drawings, in which:

FIG. 1 is a system diagram of a ΔΣ modulator;

FIG. 2 is a charge domain system diagram of a ΔΣ ADC;

DETAILED DESCRIPTION OF THE INVENTION

The present disclosure provides systems and methods for reducing the impact of residual errors due to chopping clock paths by applying a relatively low chopping frequency to compensate for offsets and low frequency noise. The relatively low chopping frequency tends to reduce the impact of sampling network mismatch effects, as well as post-chopping residual offset from the integrating amplifier. The relatively low frequency signal chopping can be part of a multistage approach in which the integrator may be chopped or not. The addition of a relatively low frequency chopping operation contributes to moving residual offsets associated with an input sampling network to an offset frequency, where the offsets have a reduced impact, or where they can be filtered.

Figure 3:
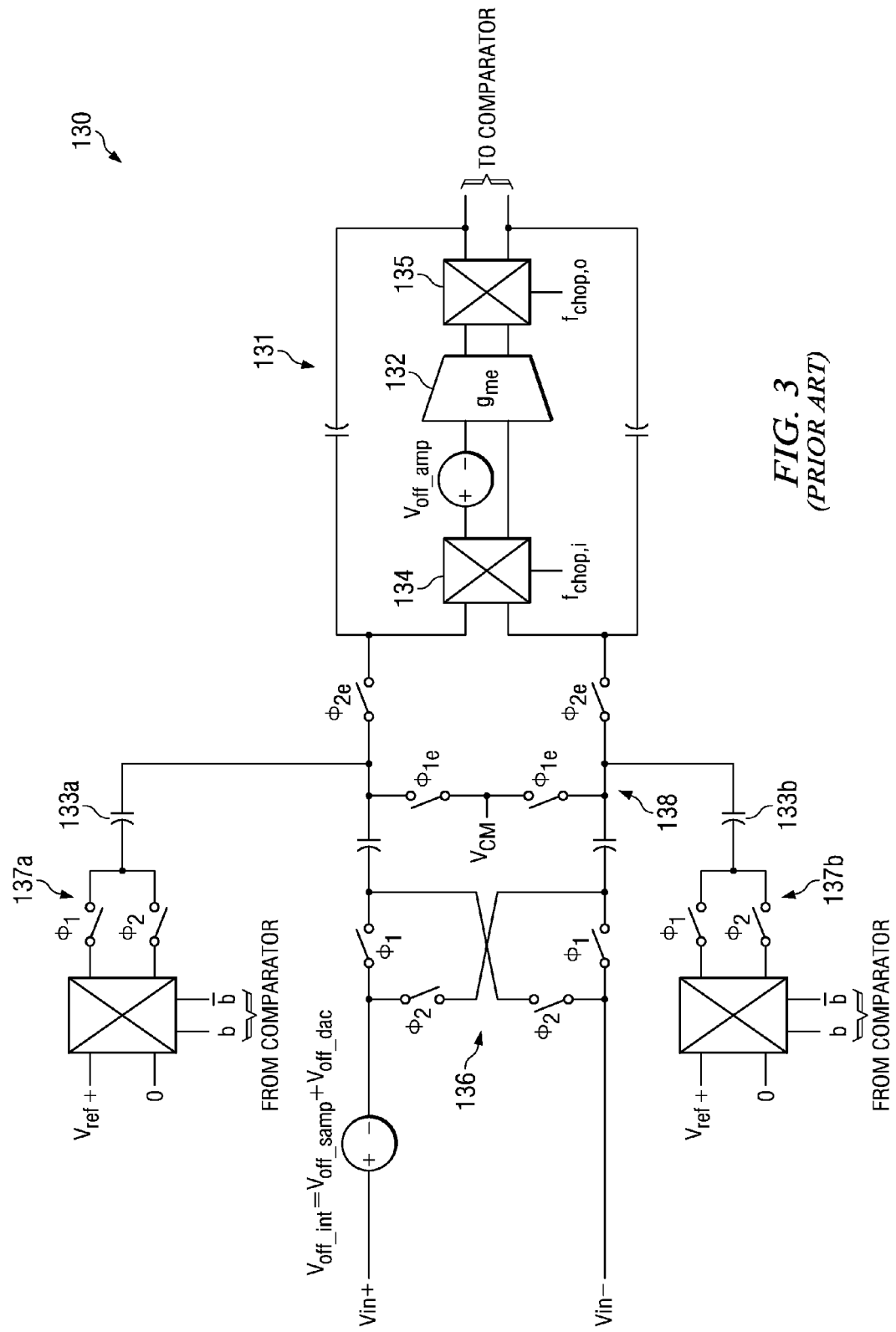
FIG. 3 is a block diagram of a portion of a ΔΣ ADC with a chopped integrator.
Figure 4:
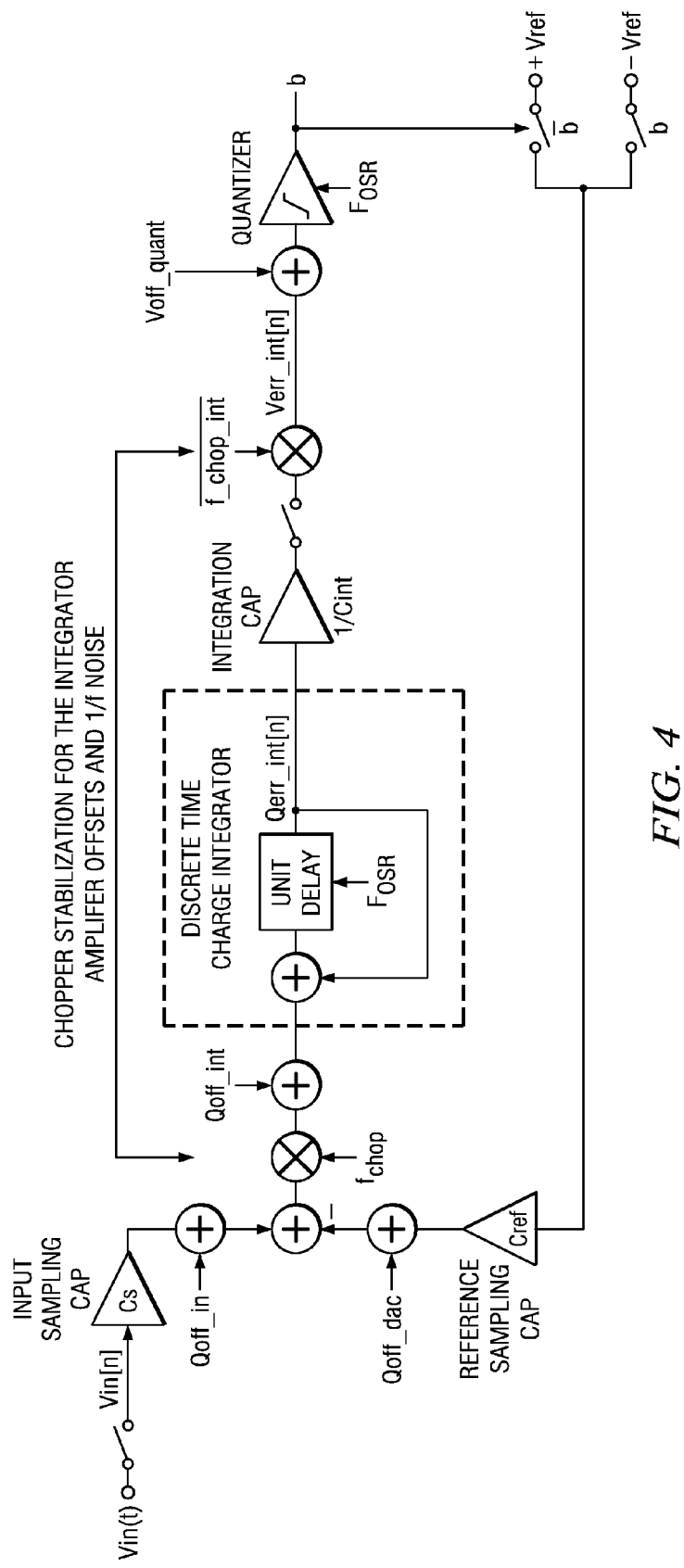
FIG. 4 is a charge domain system diagram of a ΔΣ ADC with a chopped integrator.
Figure 5:
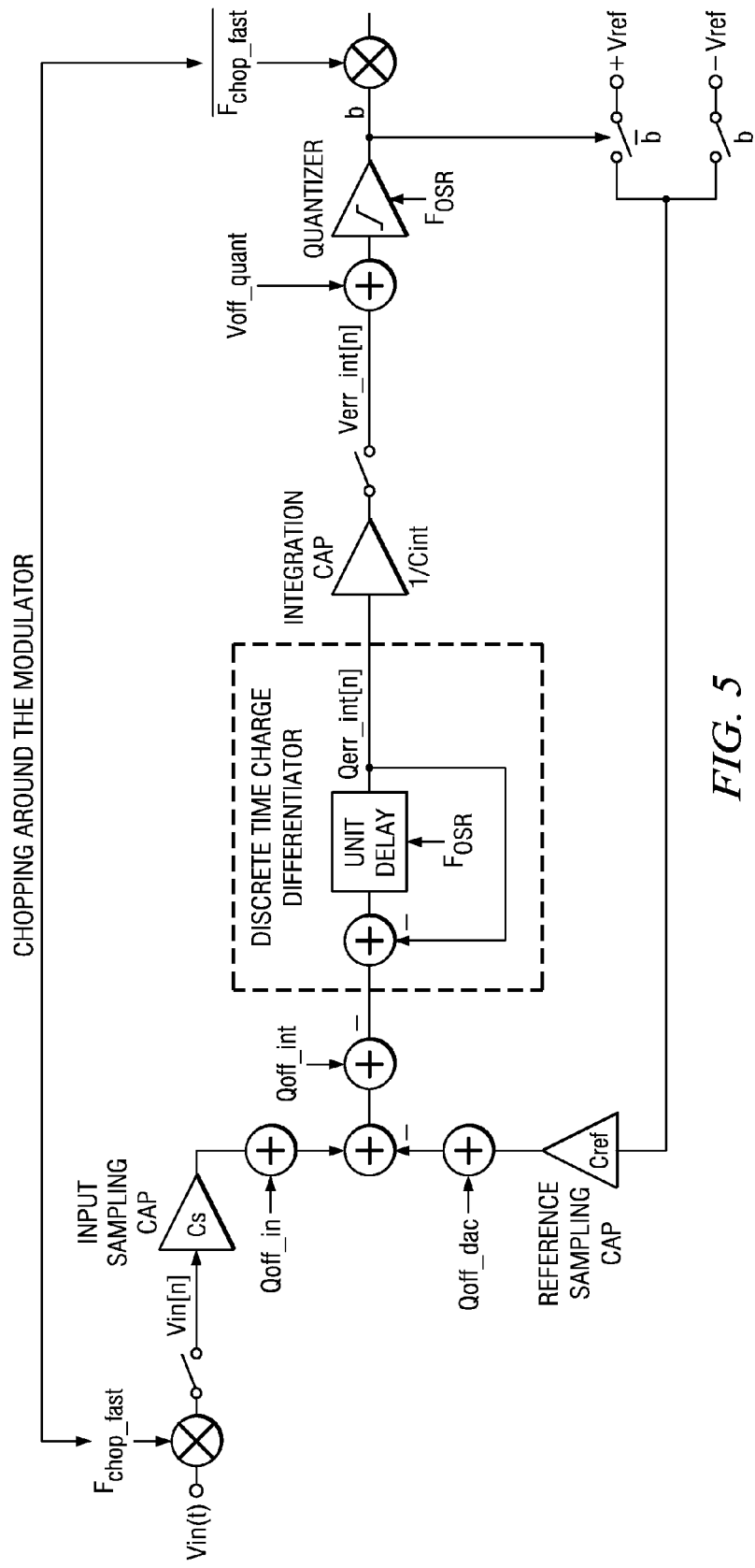
FIG. 5 is a charge domain system diagram of a ΔΣ ADC according to known configuration.
Figure 6:
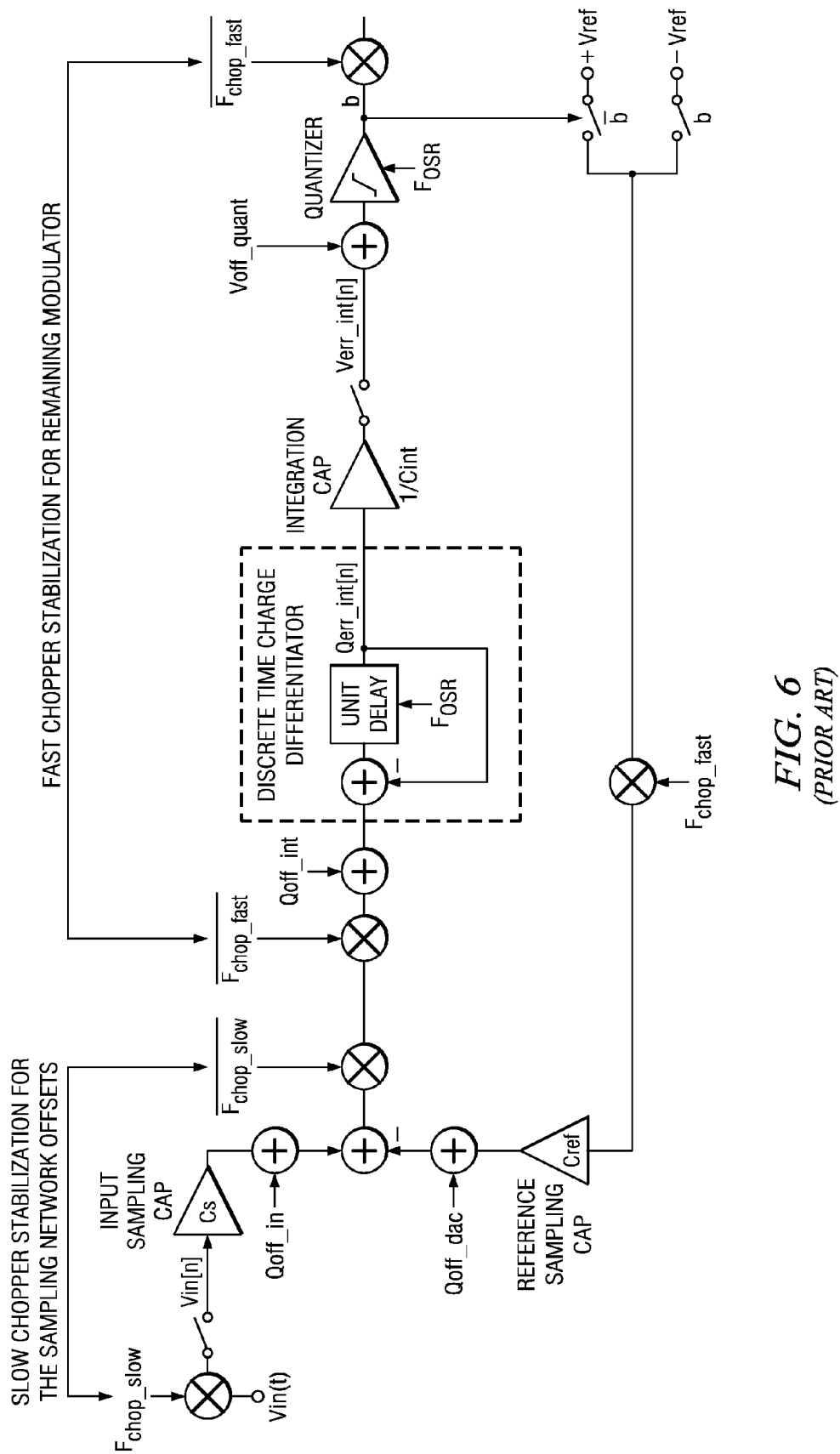
FIG. 6 is a charge domain system diagram of a ΔΣ ADC in accordance with a known configuration.
Figure 7A:
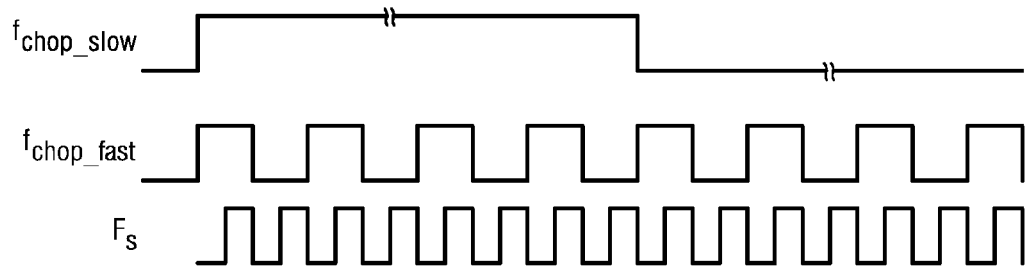
FIG. 7a is a timing diagram illustrating switching frequencies in accordance with an exemplary embodiment of the disclosed system and method.

Referring now to FIG. 7a, a timing diagram illustrates an exemplary relationship between a relatively low frequency chopping clock fchop_slow and a typical integrator chopping clock fchop_fast, with a frequency less than a sampling frequency of a sample clock Fs. FIG. 7a illustrates transition events and the polarity and frequency location relationships between signals fchop_slow, fchop_fast and Fs, where the frequency of fchop_slow is significantly less than the frequency of both fchop_fast and Fs. According to the exemplary embodiment illustrated in FIGS. 7a and 7b, the frequency of fchop_fast is about one half the frequency of Fs. In general, the frequency of fchop_fast may be expressed as Fs divided by $2^N$, where $N \geq 1$. According to one exemplary embodiment, N=9, so that fchop_fast is about Fs/512. It should be apparent that any relationship between fchop_fast and Fs may be implemented, with fchop_fast<Fs/2.

Figure 7B:
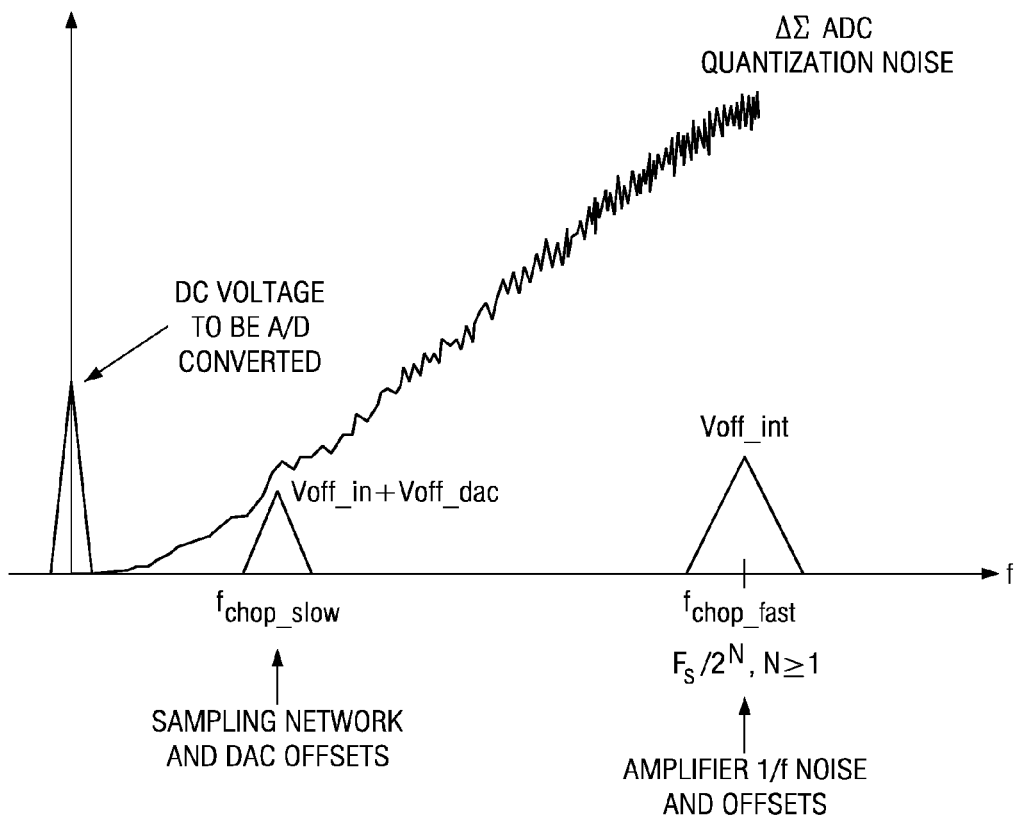
FIG. 7b is a graph of a frequency spectrum illustrating frequency shifting in accordance with another exemplary embodiment of the disclosed system and method.

FIG. 7b illustrates the frequency spectrum of the ΔΣ ADC, including a substantially DC voltage that is to be converted to a digital value. The relatively low frequency chopping clock is illustrated in the frequency spectrum with the designation fchop_slow. The relatively slow chopping clock tends to shift sampling network and DAC offsets, as well as voltage offsets Voff_in and Voff_dac, to the low frequency region, as illustrated with the power spectral density shown for signal fchop_ slow. Signal fchop_fast has a greater power spectral density, which represents a frequency shift of amplifier 1/f noise and other amplifier offsets, as well as the voltage offset Voff_int. FIG. 7b also illustrates the quantization noise, which becomes significant at greater frequencies.

Figure 8:
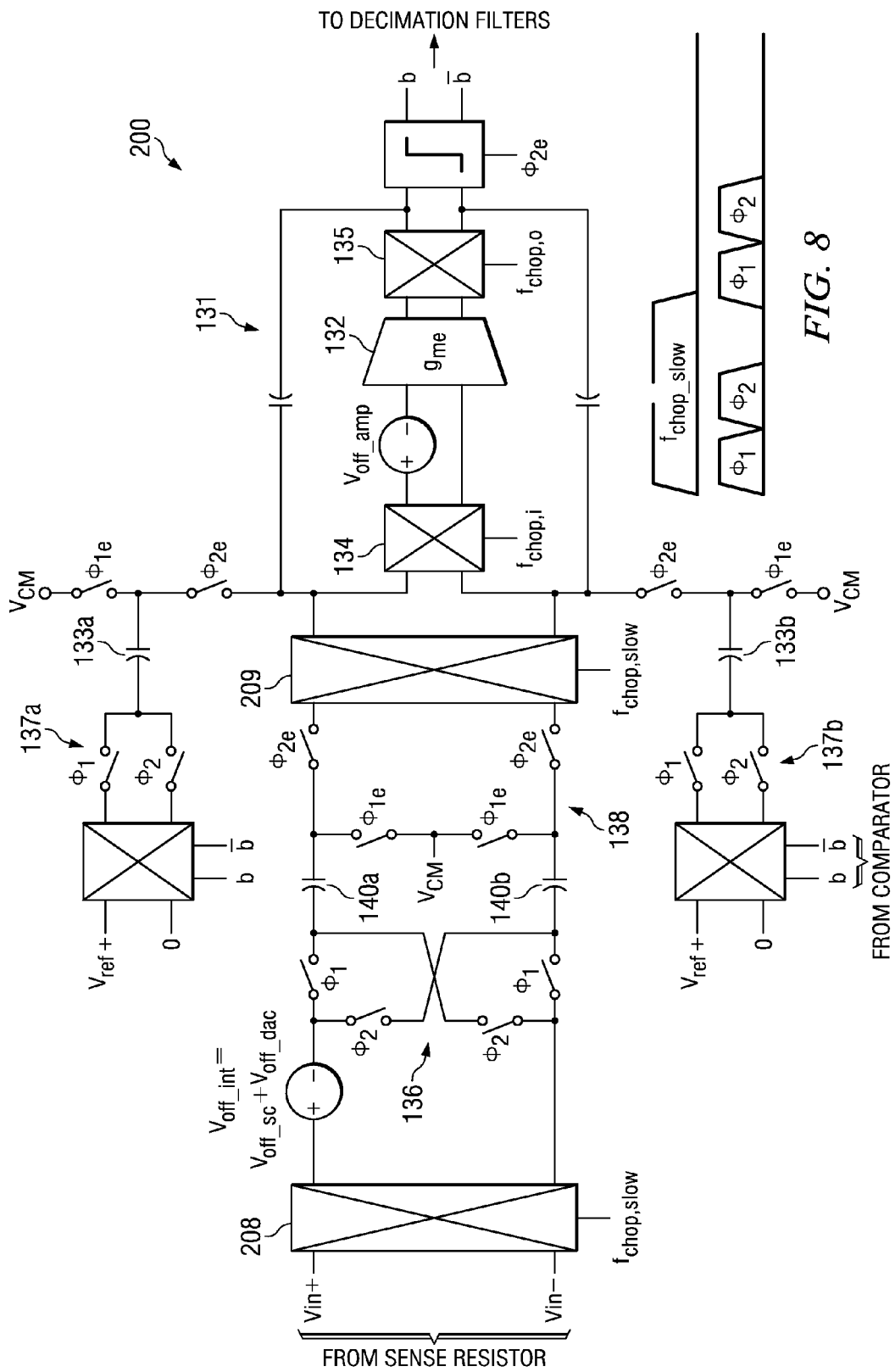
FIG. 8 is a block diagram of a ΔΣ ADC in accordance with another exemplary embodiment of the disclosed system and method.

Referring now to FIG. 8, a block diagram of a ΔΣ ADC featuring a chopped integrator in accordance with an exemplary embodiment of the disclosed system and method is illustrated as system 200. System 200 includes sampling switches 136 that alternately provide a cross-coupled or a serial pathway for the differential inputs Vin+ and Vin−. Sampling switches 138 are referenced to common mode voltage Vcm and provide common-mode sampling as well as a path to the chopped integrator input. The arrangement of sampling switches 138 is sometimes referred to as parasitic insensitive sampling, in which input sampling errors can be reduced.

Sampling switches 136 and sampling capacitors 140a, 140b, are often mismatched to a degree that causes observable offset voltages to be generated. The component mismatches are typically the result of challenges in maintaining tolerances of the components during manufacture. The fully-differential circuit inversion provided by sampling switches 136 can help to reduce some offsets, but also may introduce some residual offsets into the input of system 200. In accordance with an embodiment of the present disclosure, the input of system 200 is chopped at a relatively low frequency to switch polarity to reduce offset voltages.

In system 200, the differential input signals are slow chopped in the feed-forward path on either side of sampling switches 136, 138. A slow chopping switch 208, which can be implemented as a polarity inversion switch, is operated at a relatively slow chopping frequency with signal fchop_slow.

For example, switch 208 has cross coupled switches and serial switches arranged similarly to sampling switches 136, that are switched at about ½₅₆ the frequency of relatively high frequency chopping switches 134, 135 surrounding an operational trans-conductance amplifier (OTA) 132.

Switch 208 modulates the differential input voltage prior to sampling to contribute to reducing or removing offsets in system 200. A demodulating chopping switch 209 is positioned after sampling switches 136, 138, and is operated at a relatively low frequency with signal fchop_slow to demodulate the chopped, sampled differential input. In the configuration of system 200, the slow chopping switches 208, 209 are referred to as a sequential chopping arrangement, where the slow chopping offset reduction is sequential with integrator chopping. Charge injection errors due to feedback DAC switches 137a, 137b are outside of the slow chopping modulation/demodulation, and disturbances to the feedback error signal due to slow chopping are avoided. The offsets due to the feedback DAC signals b and $\overline{b}$ are not chopped. FIG. 8 illustrates the relative timing of the assertion of the fchop_slow signal relative to phases φ1 and φ2 used for controlling input sampling switches 136, 138.

With the sequential chopping arrangement of system 200, offsets can be reduced or removed without impacting the relatively fast chopping of integrating amplifier 131. Some residual offset voltages may remain after sequential chopping in the feed forward path, due to the lack of feedback, for example.

Figure 9:
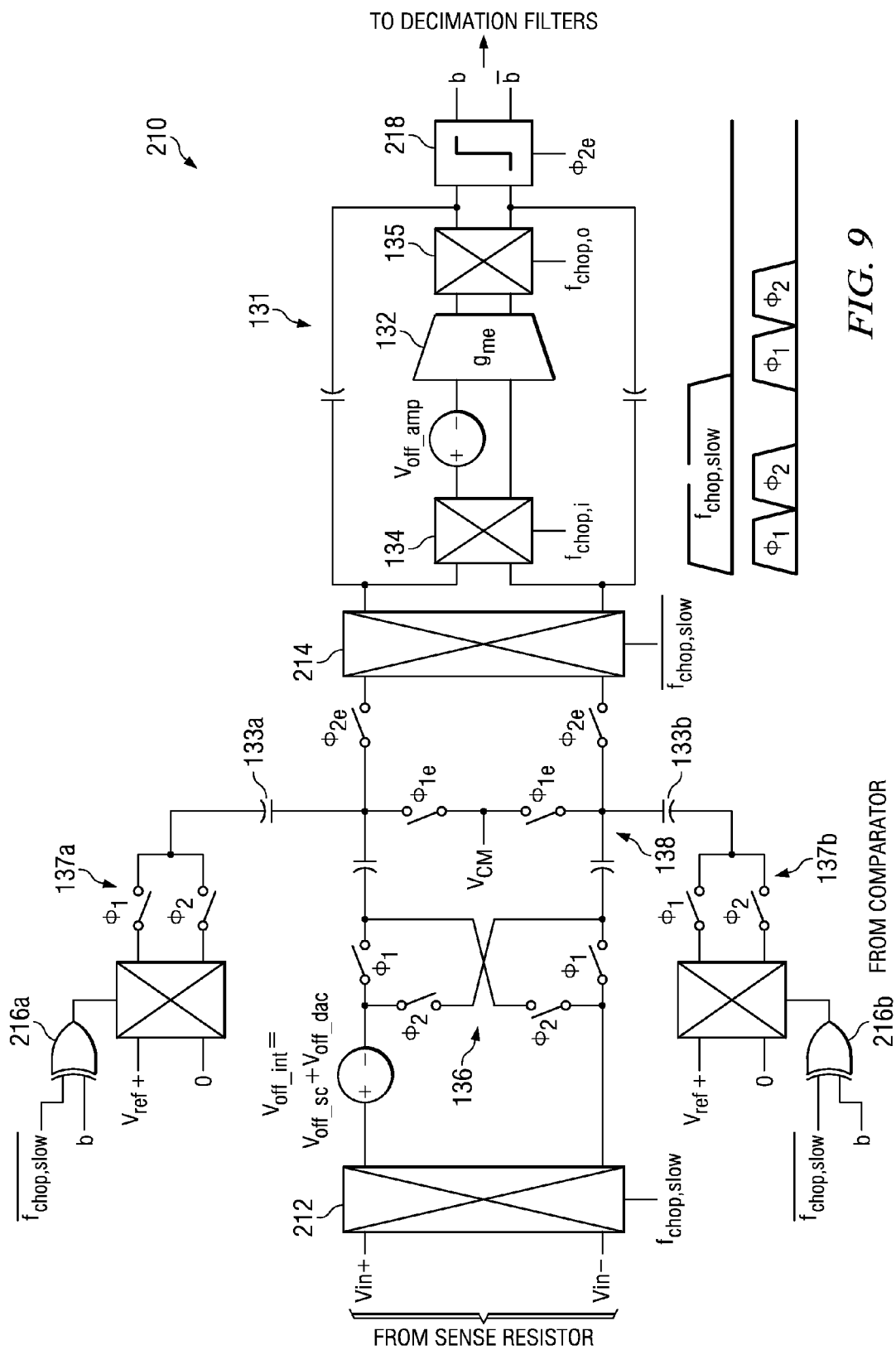
FIG. 9 is a block diagram of a ΔΣ ADC in accordance with another exemplary embodiment of the disclosed system and method.

Referring now to FIG. 9, a block diagram of a ΔΣ ADC featuring a chopped integrator 131 in accordance with an exemplary embodiment of the disclosed system and method is illustrated as system 210. With the configuration of system 210, a chopping switch 212, which may be implemented as a polarity inversion switch, provides a chopping operation to modulate the analog input at a relatively low chopping frequency with signal fchop_slow. A demodulating chopping switch 214 operates at relatively low frequency with signal fchop_slow. In the configuration illustrated in FIG. 9, the feedback DAC signal paths are also chopped by the relatively slow chopping operation. Accordingly, the DC offsets for the feedback DAC are also subject to the relatively slow chopping operation. In addition, because the feedback DAC signal path is inside the relatively slow chopping nest, the logic polarity of the feedback is inverted at a rate corresponding to the frequency of signal fchop_slow to correct for the impact of switching in the closed loop. The inversion the logic polarity takes place with XOR gates 216a, 216b, which have bit inputs from a quantizer or comparator 218 and the demodulation chopping signal $\overline{\text{fchop\_slow}}$, which is an inversion of fchop_slow.

In FIG. 9, the ΔΣ ADC configuration places the charge injection errors due to feedback DAC inside the slow chopping loop represented by chopping switches 212, 214. The offsets due to the feedback DAC are also chopped. Similar to FIG. 8, FIG. 9 illustrates the timing relationship between the assertion of control signal fchop_slow and control signals φ1 and φ2 used to control input sampling switches 136, 138.

Figure 10:
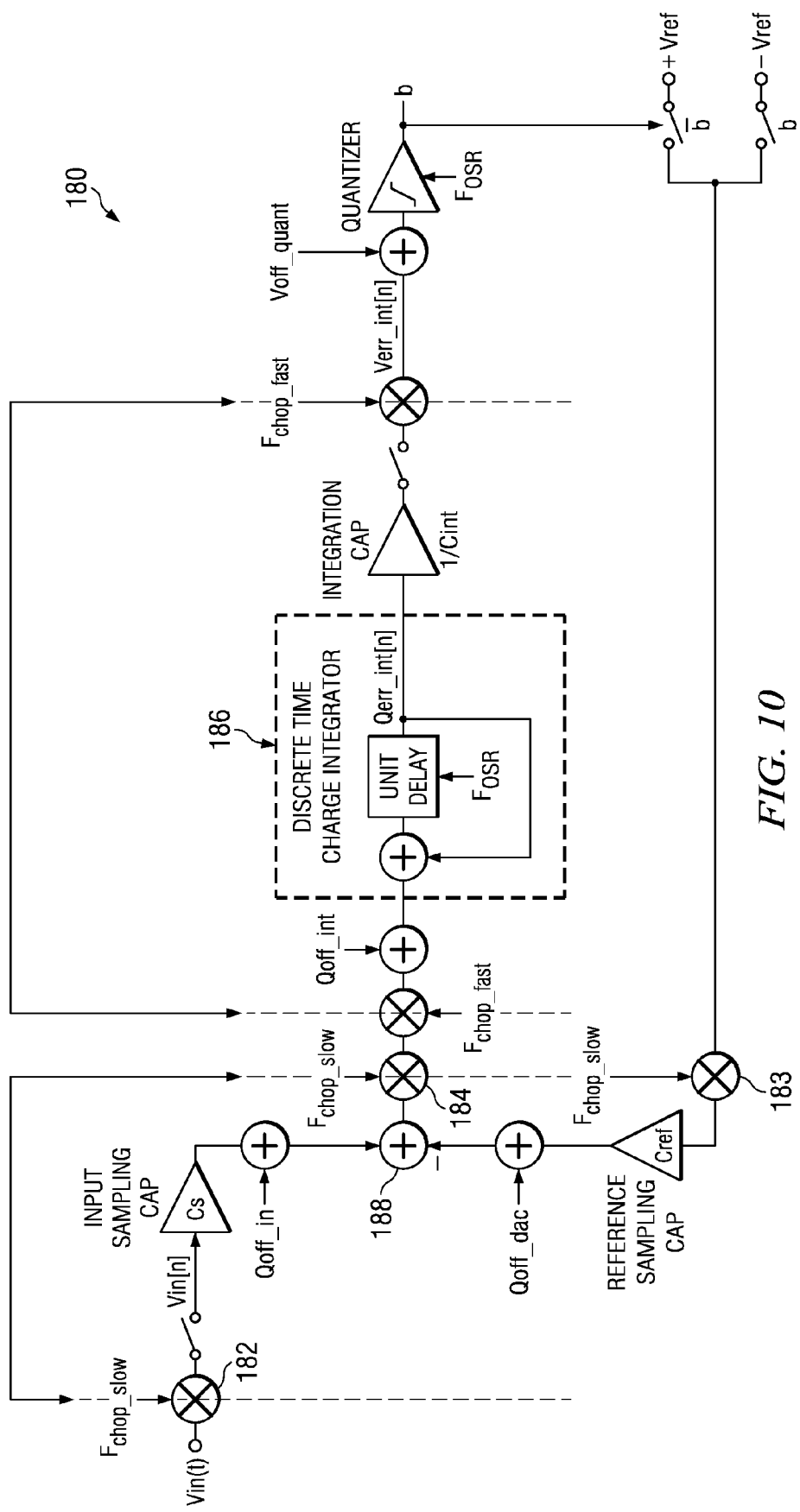
FIG. 10 is a charge domain system diagram of the ΔΣ ADC of FIG. 9.

Referring now to FIG. 10, a charge domain diagram is illustrated of a system 180 that models the ΔΣ ADC embodiment of system 210 shown in FIG. 9. In the exemplary embodiment of system 180, a slow chopping switch, which may be implemented as a polarity inversion switch, is located prior to the sampling network of the ΔΣ ADC, as represented by a multiplier 182. The chopping switch is switched, or clocked, with signal fchop_slow, which is relatively low frequency, corresponding to a relatively slow switching speed to modulate the input voltage Vin(t). Multiplier 182 up-converts the error input signal to a relatively low intermediate frequency represented by signal fchop_slow. Another chopping switch, represented with a multiplier 183, is provided in the feedback path of the closed loop system, also operated at the relatively low frequency of signal fchop_slow. Accordingly, the inputs to a summing element 188 are modulated with the relatively low chopping frequency of signal fchop_slow.

Another slow chopping switch as represented by a multiplier 184 is located within the feedback loop prior to a chopped integrating amplifier 186, and down-converts the signal back to DC with a frequency of signal fchop_slow. Multipliers 182-184 represent a modulation and demodulation of slow chopping applied to an input stage of ΔΣ ADC, which provides slow chopping stabilization for the sampling network offsets. Chopped integrating amplifier 186 also has multipliers on an input and an output that are multiplied with fast chopping control signal fchop_fast. The fast chopping multipliers provide fast chopper stabilization for the integrating amplifier offsets and 1/f noise.

Multiplier 184 demodulates the slow chopped sampling network signal back to a DC level. With the demodulation of the signal back to DC, the residual DC offsets are up-converted to a higher frequency. In this configuration, integrating amplifier 186 operates on the output of summing element 188, which represents the difference between the input and the feedback DAC outputs.

Figure 11:
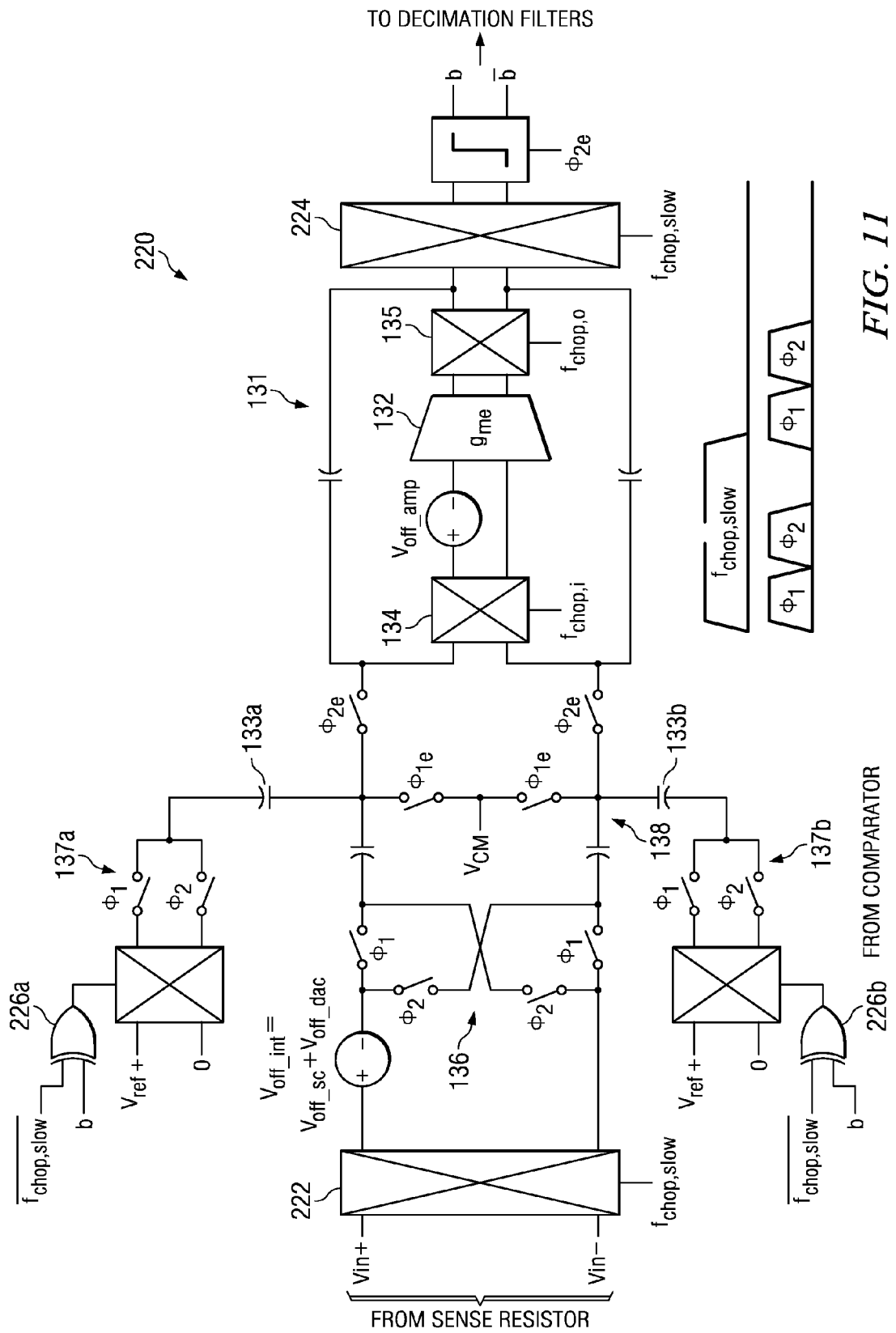
FIG. 11 is a block diagram of a ΔΣ ADC in accordance with another exemplary embodiment of the disclosed system and method.

Referring now to FIG. 11, a diagram of a ΔΣ ADC system 220 in accordance with an exemplary embodiment of the disclosed system and method is illustrated. System 220 has a slow chopping switch 222 that is operated at a relatively slow chopping frequency with signal fchop_slow to modulate the differential input voltage represented by Vin+ and Vin−. A slow chopping switch 224 is located to demodulate an output of integrating amplifier 131 at a relatively low frequency determined by signal $\overline{\text{fchop\_slow}}$.

In the configuration of system 220, the feedback DAC is inside the nest of the slow chopping operation. Accordingly, the DC offsets of the feedback DAC are also subject to the relatively slow chopping operation. The slow chopping configuration shown in system 220 is referred to as a nested chopping arrangement, since chopper stabilized integrator 131 is located within the slow chopping loop. To compensate for frequency placement and polarity changes induced by the chopping operation being placed in the feedback loop, XOR gates 226a, 226b are used to apply a corrected polarity of the feedback DAC bit at every cycle of the chopping signal, represented by $\overline{\text{fchop\_slow}}$. XOR gates 226a, 226b with inputs b and $\overline{\text{fchop\_slow}}$ cause the feedback DAC bit to be inverted at the fchop_slow rate to correct for switching activity within the overall closed loop system. This arrangement can benefit from a compensation to handle an error that may be induced due to the residual charge stored in the integrator 131.

Figure 12:
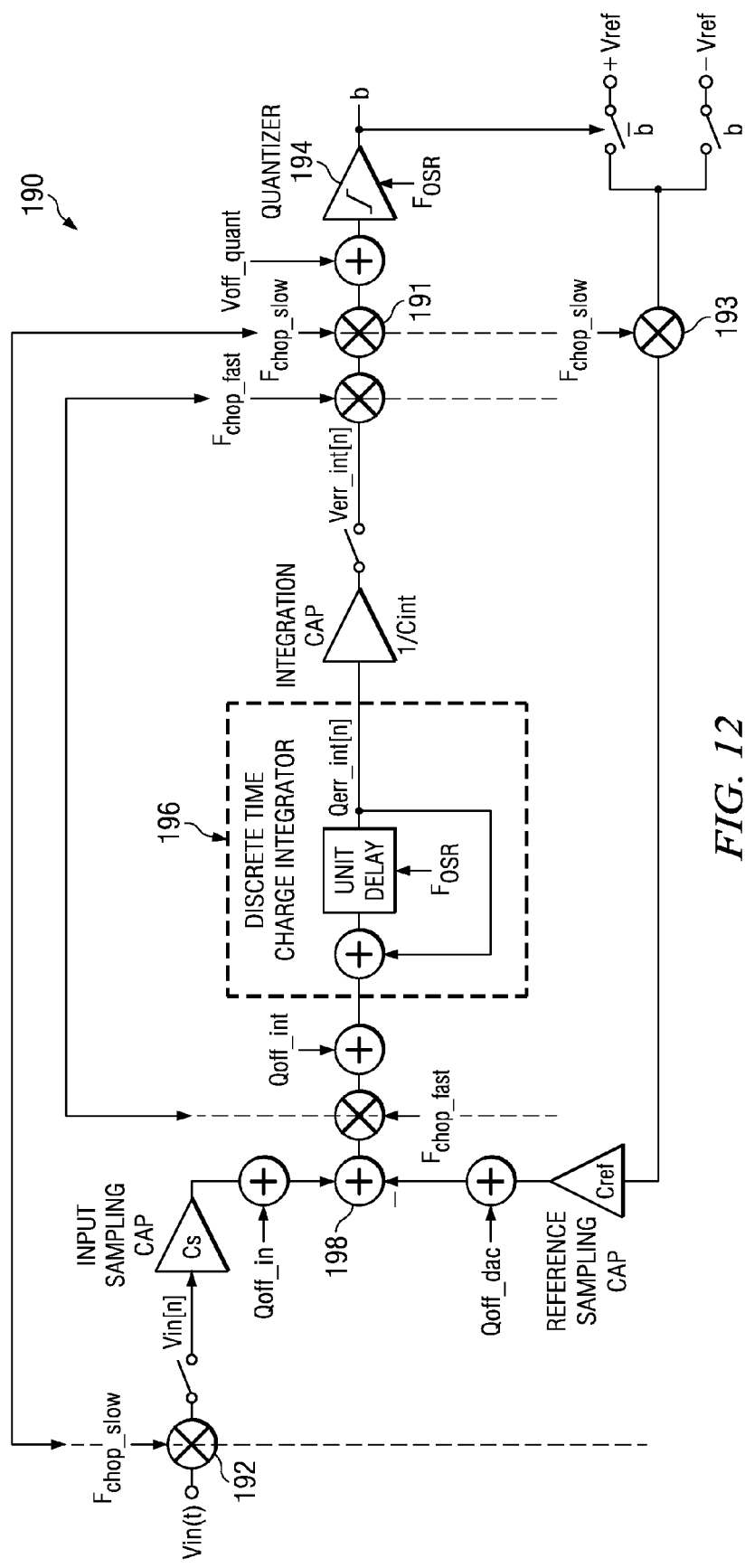
FIG. 12 is a charge domain system diagram of the ΔΣ ADC of FIG. 11.

Referring now to FIG. 12, a charge domain diagram is illustrated of a system 190 that models the ΔΣ ADC embodiment of system 220 shown in FIG. 11. In system 190, a chopping switch represented as a multiplier 192 is implemented before the sampling network and clocked at a relatively slow chopping frequency with signal fchop_slow to modulate an input voltage Vin(t). The relatively slow switching speed up-converts the input signal to a relatively low intermediate frequency. Another relatively slow chopping switch represented by a multiplier 193 is provided in the feedback path of the closed loop system and switched at a relatively slow chopping frequency with signal fchop_slow. Accordingly, the inputs to a summing junction 198 are both chopped at the relatively slow chopping frequency with signal fchop_slow, which provides slow chopper stabilization for the sampling network offsets.

In the embodiment illustrated in system 190, an integrating amplifier 196 operates on the output of summing junction 198. The output of integrating amplifier 196 is demodulated with a slow chopping switch operated at the relatively low frequency with signal fchop_slow, represented as a multiplier 191 located in the forward path and inside the feedback loop of system 190. The demodulation provided at multiplier 191 produces a final signal with the same frequency location and polarity as the input, to be applied to a comparator or quantizer 194. The ΔΣ ADC in system 190 illustrates a nested chopping arrangement of a first order ΔΣ ADC.

Integrating amplifier 196 is chopped at a fast rate through the application of fast chopping multiplier signals fchop_fast applied to multipliers surrounding integrating amplifier 196. The fast chopping multipliers provide fast chopper stabilization for integrating amplifier 196 to stabilize offsets and 1/f noise.

Figure 13:
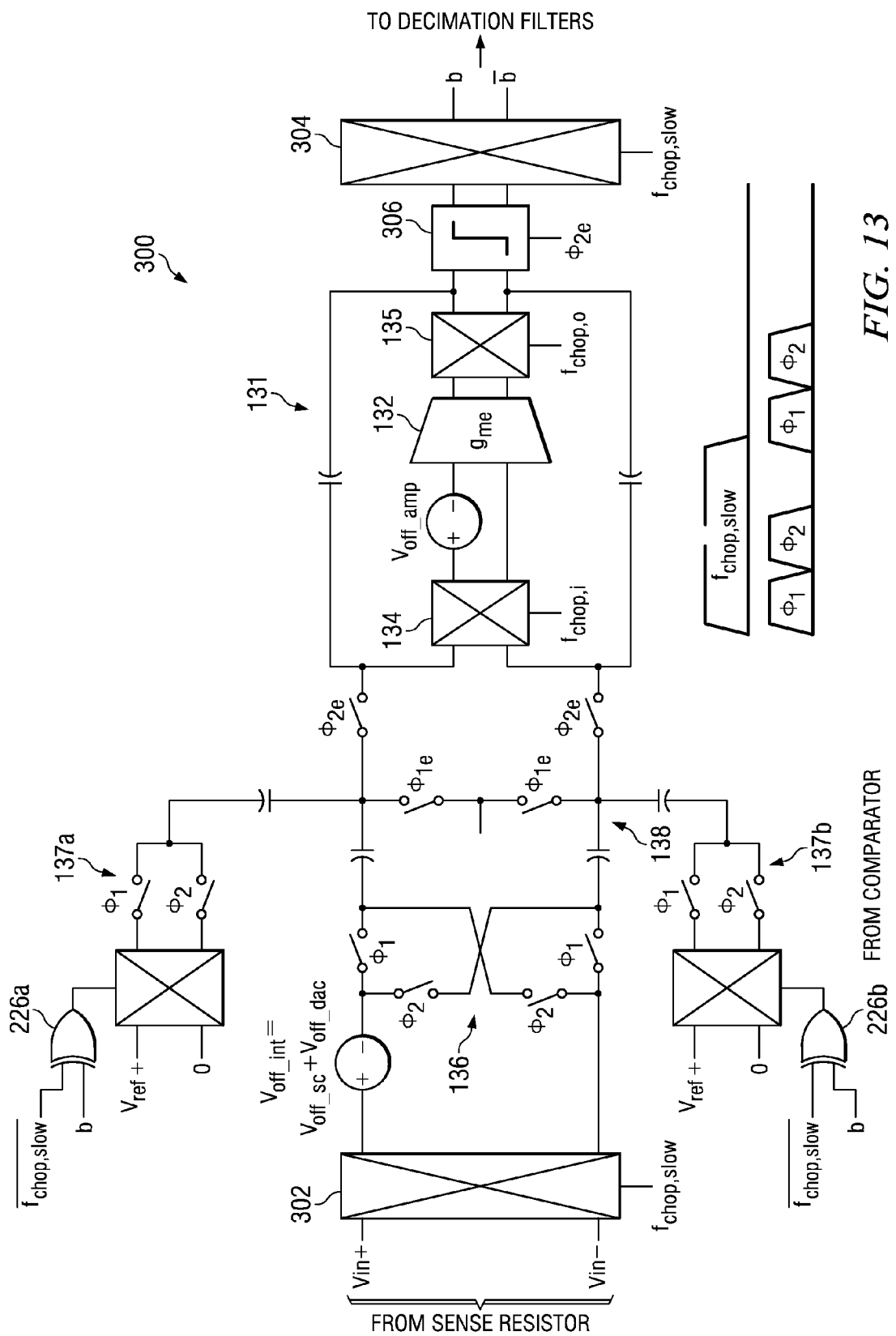
FIG. 13 is a block diagram of a ΔΣ ADC in accordance with another exemplary embodiment of the disclosed system and method.

Referring now to FIG. 13, a diagram of a ΔΣ ADC system 300 in accordance with an exemplary embodiment of the disclosed system and method is illustrated. System 300 has a slow chopping switch 302 that is operated at a relatively slow chopping frequency with signal fchop_slow to modulate the differential input voltage represented by Vin+ and Vin−. Chopping switch 304 chops the output of a comparator 306, which provides the bitstream output of the ΔΣ modulated ADC of system 300. The bitstream output of comparator 306 is also fed back to the input to provide previous conversion information to the next conversion.

In the configuration of system 300, the feedback DAC is inside the nest of the slow chopping modulation/demodulation. Accordingly, the DC offsets of the feedback DAC are also subject to the relatively slow chopping operation. To compensate for frequency placement and polarity changes induced by the chopping operation being placed in the feedback loop, XOR gates 226a, 226b are used to apply a corrected polarity of the feedback DAC bit at every cycle of the chopping signal, represented by input $\overline{\text{fchop\_slow}}$. XOR gates 226a, 226b with inputs b and $\overline{\text{fchop\_slow}}$ cause the feedback DAC bit to be inverted at the fchop_slow rate to correct for switching activity within the overall closed loop system. FIG. 13 also illustrates a relationship between slow chop control signal fchop_slow and the sampling input network control signals φ1, φ2 used to control sample switches 136, 138. For example, fchop_slow is illustrated as being asserted at a beginning of a sampling switching cycle illustrated with sample control signal φ1 being asserted. Slow chopping control signal fchop_slow is illustrated as being deasserted at the rising edge of sample control signal φ1.

Figure 14:
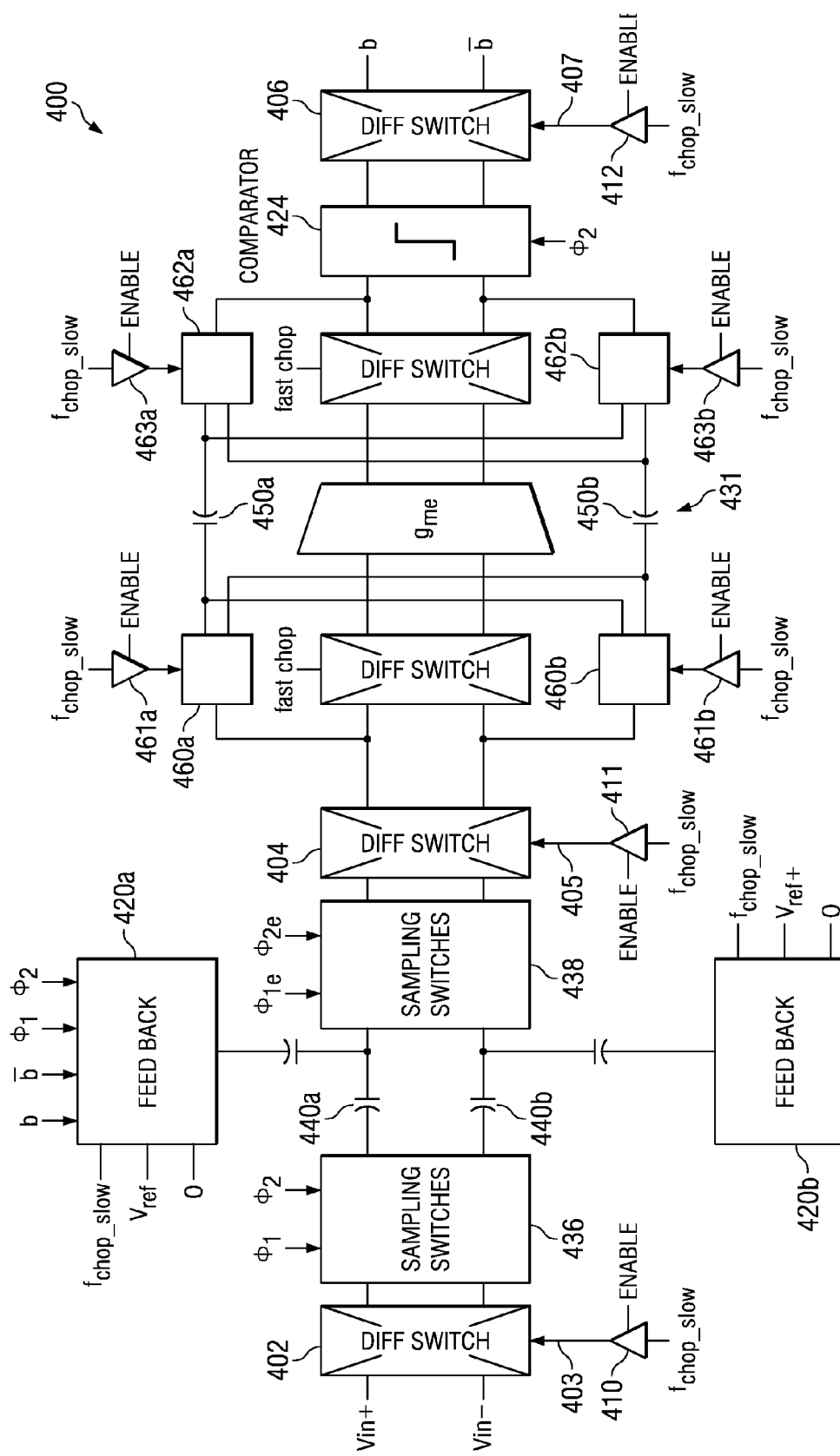
FIG. 14 is a block diagram of a ΔΣ ADC in accordance with another exemplary embodiment of the disclosed system and method.

Referring now to FIG. 14, another embodiment of a ΔΣ ADC in accordance with the disclosed system and method is illustrated as system 400. System 400 includes an input slow chopping switch 402 that is switched at a relatively slow chopping frequency with signal fchop_slow to modulate the differential input voltage represented by Vin+ and Vin−. Chopping switch 402 can be implemented as a polarity inversion switch that can alternately cross-couple inputs to outputs or couple inputs directly to outputs, depending upon a state of input 403. Input 403 is set to the relatively slow frequency signal fchop_slow upon being enabled. An output of chopping switch 402 is provided to sampling switches 436, which may be implemented as sampling switches 136 as illustrated in FIG. 8. Sampling capacitors 440a and 440b store sampled input voltages, as sampled by sampling switches 438, which may be implemented as switches 138 illustrated in FIG. 8.

The exemplary embodiment of a ΔΣ ADC illustrated in system 400 can provide selective sequential chopping, nested chopping, or neither. In a sequential chopping arrangement, slow chopping switch 404 operates to switch the differential inputs provided from sample switches 438. Chopping switch 404 may be implemented as a polarity inversion switch to demodulate the slow chopped input differential signals provided through sampling switches 438. For example, chopping switch 404 can be composed of cross-coupled switches and direct feed through switches, similar to the arrangement of sampling switches 136 illustrated in FIG. 8. The state of chopping switch 404 depends upon input 405, which is supplied with the relatively low frequency signal fchop_slow. When sequential chopping is enabled, the enabled signal on each of gates 410, 411 is asserted to permit the fchop_slow signal to pass to chopping switches 402, 404 respectively. When sequential chopping is disabled, the enable signal on gate 411 causes input 405 to be in a fixed state independent of signal fchop_slow, so that chopping switch 404 passes the differential signals through to the forward path for system 400 without demodulation. If slow chopping is disabled altogether, whether sequential or nested, the enable signal applied to gate 410 similarly causes input 403 to remain in a fixed state independent of signal fchop_slow so that chopping switch 402 passes differential input voltages Vin+ and Vin− to sampling switches 436 without modulation. For example, chopping switch 402, as well as other switches discussed above, may remain in a directly connected or cross-connected state and not switch a respective input signal.

System 400 also includes a slow chopping switch 406 provided at an output of comparator 424 to provide a nested chopping operation at a relatively low frequency with signal fchop_slow. Chopping switch 406 can be implemented as a polarity inversion switch that operates to provide a cross-coupled switching between the outputs of comparator 424, as well as a direct pass through to outputs b and $\overline{b}$. Chopping switch 406 is enabled in a nested chopping mode when gate 412 is enabled to pass signal fchop_slow to chopping switch 406 as a control input 407. When nested chopping is enabled, gates 410, 412 are switched to permit signal fchop_slow to pass to respective control inputs 403, 407 to switch respective chopping switches 402, 406 at the frequency indicated by signal fchop_slow. In the nested chopping arrangement, sequential chopping switch 404 is disabled by placing gate 411 in a state to prevent signal fchop_slow from passing to control input 405. In such an instance, sequential chopping switch 404 passes the output of compensation switches 438 to integrating amplifier 431.

Because nested chopping switch 406 is inside the feedback loop of system 400, considerations are taken to ensure the appropriate feedback polarity and timing is applied to integrating amplifier 431. For example, the first feedback b or $\overline{b}$ that occurs after a nested chopping clock edge can be inverted to obtain the appropriate polarity in relation to integrating capacitors 450a, 450b. Integrating capacitors 450a, 450b are chopped prior to the application of the inverted feedback b, $\overline{b}$. The polarity inversion of the feedback bit b, $\overline{b}$ may also be shifted one sample period from the nested chop clock, since the feedback data is delayed by one sampling clock cycle. The control logic to implement the inversion of the feedback data resulting from nested chopping is provided in feedback control switches 420a, 420b. Control switches 420a, 420b have as inputs b, $\overline{b}$, sampling signals φ1, φ2 and signal fchop_slow. Control switches 420a, 420b also have a reference voltage input Vref, as well as a zero (0) voltage reference, both of which can contribute to providing a voltage conversion scale. The feedback voltages provided by control switches 420a, 420b are based on the appropriate polarity and timing of the feedback, given the impact of the slow chopping operation provided by nested chopping switch 406.

Integrating capacitors 450a, 450b retain residual conversion information after comparator 424 converts the output of integrating amplifier 431 to a digital signal. Comparator 424 makes a decision to output a logic 1 or a logic 0 for bit stream b, b̄ based on the information on integrating capacitors 450a, 450b. The integrated quantization error that occurs during a conversion by comparator 424 can also be maintained to have a correct polarity during nested chopping by ensuring that the feedback voltage on each of capacitors 450a, 450b is applied to the correct polarity input of integrating amplifier 431. A polarity switch for capacitors 450a, 450b involves "swapping" the capacitor connections between the differential signal pathways of integrating amplifier 431. To achieve such a swap of the capacitors with the respective stored charges, the connections on capacitors 450a, 450b are physically tied to multiplexers 460a, 460b, 462a and 462b.

Multiplexors 460a, 460b are connected to receive an input from, for example, a cathode side of respective capacitors 450a, 450b. Similarly, multiplexors 462a, 462b are connected to receive an input from an anode side of capacitors 450a, 450b. Each of multiplexors 460a, 460b, 462a, 462b operate to provide direct signal paths upon being switched, for example, to pass analog voltage values and signals. The outputs of multiplexors 460a, 460b are each connected to a differential signal input path of integrating amplifier 431, while the outputs of multiplexors 462a, 462b are connected to the differential signal output paths of integrating amplifier 431.

When system 400 is operated in nested chopping mode, multiplexors 460a, 460b, 462a, 462b are all enabled to be switched at an appropriate time to swap capacitors 450a, 450b to the different polarity signal pathways of integrating amplifier 431. Multiplexors 460a, 460b, 462a, 462b are operated using the fchop_slow signal applied to nested chopping switches 402, 406. As with nested chopping switches 402, 406, the fchop_slow control signal is enabled in nested chopping mode to permit multiplexors 460a, 460b, 462a, 462b to be switched to appropriately modulate integrating capacitors 450a, 450b to account for the integrated quantization error derived during operation. The fchop_slow control signal applied to each of multiplexors 460a, 460b, 462a, 462b is enabled through a respective gate 461a, 461b, 463a, 463b to permit modulation of integrating capacitors 450a, 450b during nested chopping operations. When gates 461a, 461b, 463a, 463b are disabled, multiplexors 460a, 460b, 462a, 462b are not switched, and maintain a connection for capacitors 450a, 450b on a respective differential signal path of integrating amplifier 431.

When nested chopping is enabled, chopping switches 402, 406 are active to provide slow chopping of the differential input voltage and the output provided by comparator 424. Control switches 420a, 420b are also operated to invert a first feedback bit after a nested chopping clock edge of the fchop_slow signal, as well as to delay the inversion of the output data by one sampling period from the nested chop clock edge since the feed back data is delayed by one data sampling clock cycle. In addition, the voltage values on capacitors 450a, 450b are modulated to have an appropriate polarity regarding connections to the differential signal pathways of integrating amplifier 431 during nested chopping mode. Accordingly, if the polarity of the input to integrating amplifier 431 is switched based on a slow chopped feedback, the feedback to integrating amplifier 431, i.e., the capacitors 450a, 450b, are switched as well.

System 400 provides a configuration for a ΔΣ ADC that can reduce or eliminated voltage offsets due to the application of slow chopping of analog and/or digital signals. The slow chopping can be disabled, or enabled in a sequential chopping mode or a nested chopping mode. One of the advantages of providing a sequential chopping mode to reduce offsets in system 400 is the reduced impact on the overall system, so that it is possible to increase a frequency of the slow chopping control signal, which can permit potentially faster conversion operations. Nested chopping mode has an advantage in a greater reduction in voltage offsets, including residual offsets that are introduced through the chopping operation itself. Nested chopping may have a frequency of operation that is relatively slow because residual errors can increase with chopping frequency. As an example, the ΔΣ ADC of system 400 operated in nested chopping mode has a chopping frequency that is about one half the conversion frequency. If the ΔΣ ADC provides a conversion every second, for example, the fchop_slow control signal has a frequency of about ½ Hz, or a period every two seconds although ¼ of a sample cycle out of phase, for example.

The points in time at which the fchop_slow signal is active, i.e., has a rising or falling edge, can be set to match or avoid specific time frames during the occurrence of noise introduced from systemic synchronous activity, or known time intervals in which noise may be introduced into the system. For example, if it is known that a particular occurrence of periodic analog or digital noise is expected at a certain time in the operation of the system, a rising or falling edge of fchop_slow can be set to coincide or avoid such a point in time. Synchronous systemic noise may be provided by other components such as a DSP, a decimation filter or a CPU, which may act as synchronous noise sources. The slow chopping clock signal fchop_slow may be configured to coincide with, allow the chopping of or avoid the greater or lesser instances of synchronous systemic noise.

In sequential chopping mode, the slow chopping operation does not include integration capacitors 450a, 450b, so additional processing of the digital data can be avoided which can also lead to reduced noise. Because of polarity inversions that may occur during input sampling, the feedback data b, b̄ may be inverted for half of the period of the fchop_slow control signal to match the appropriate polarity for the input sampling network.

While system 400 is illustrated as having gates 410-412 and 461a, 461b, 463a, 463b to enable or disable slow chopping, or various modes of slow chopping, it should be apparent that such gates may be eliminated and the fchop_slow control signal can be selectively controlled to provide a static or switched value to chopping switches 402, 404, 406, or multiplexors 460a, 460b, 462a, 462b, depending upon the chopping mode or lack of chopping.

Figure 15:
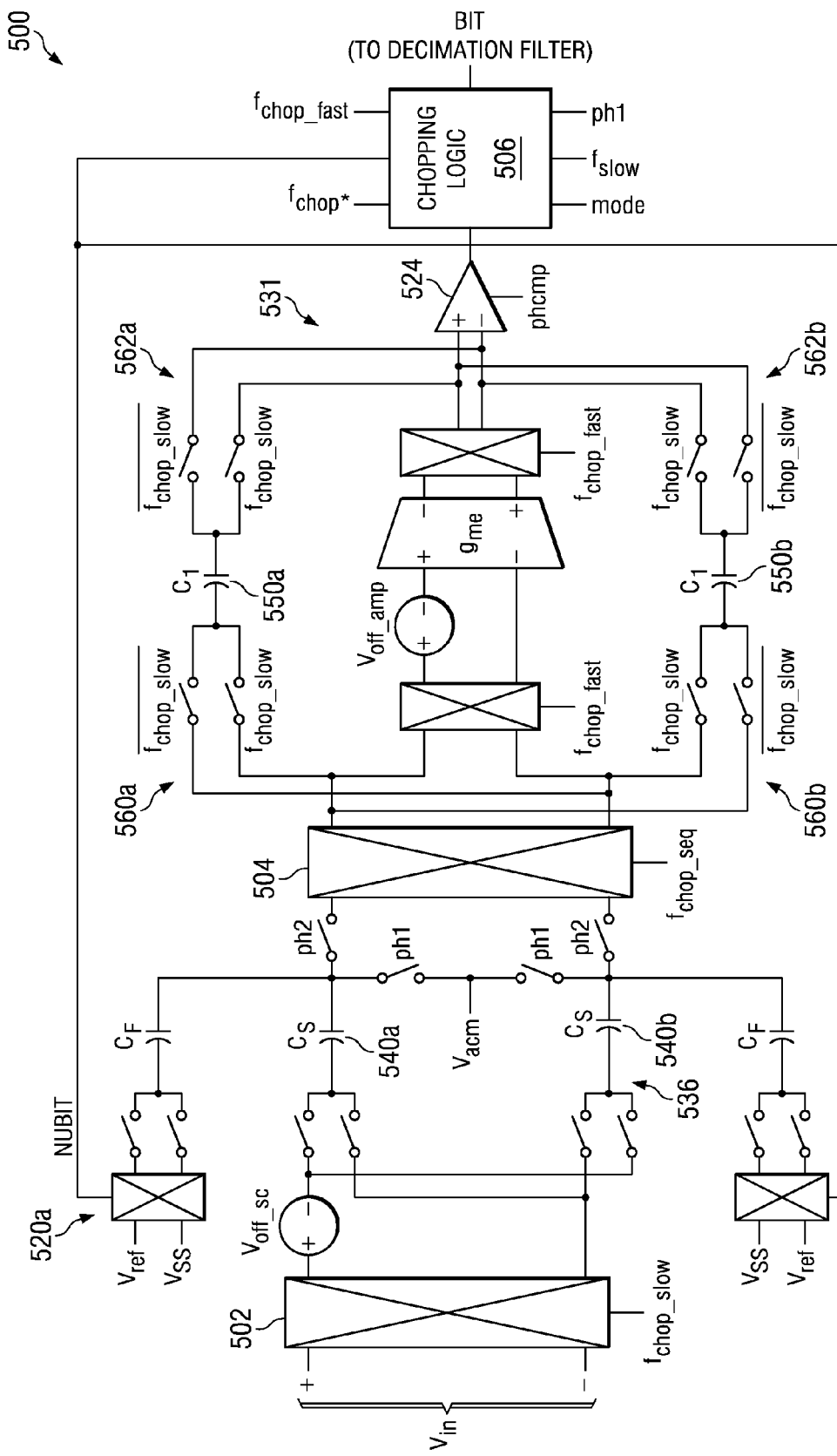
FIG. 15 is a block diagram of a ΔΣ ADC in accordance with another exemplary embodiment of the disclosed system and method.
Figure 16A:
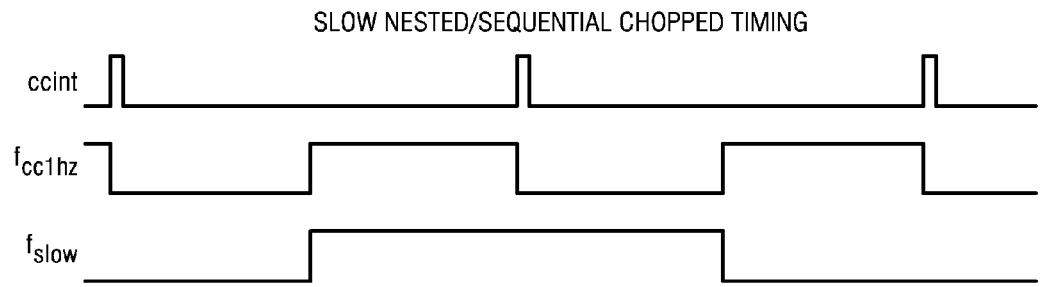
FIGS. 16a and 16b are timing diagrams illustrating compensation for the polarity change resulting from the application of the slow chopping clock.
Figure 16B:
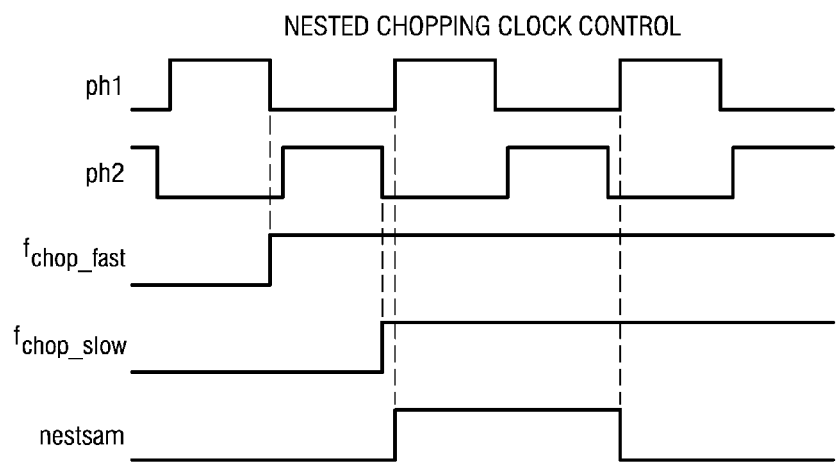

Referring now to FIGS. 15, 16a and 16b, a block diagram of a ΔΣ ADC and associated timing diagrams in accordance with an exemplary embodiment of the disclosed systems and methods are illustrated. FIG. 15 illustrates a system 500 for a ΔΣ ADC that permits selective slow sequential chopping, slow nested chopping, or disabled slow chopping. FIGS. 16a, 16b illustrate the operation of switching components in system 500 to achieve various objects of the disclosed system and method. System 500 includes a relatively fast chopped integrating amplifier 531, a comparator or quantizer 524, sampling network 536 and feedback sections 520a, 520b. Integrating amplifier 531 includes switches 560a, 560b, 562a, 562b for swapping the integrating capacitors 550a, 550b. Switches 560a, 560b, 562a, 562b connect capacitors 550a, 550b to one or the other of the differential pathways of integrating amplifier 531 during nested chopping operations. Signal fchop_slow, and its complement fchop_slow, are used to drive switches 560a, 560b 562a, 562b during nested chopping operations to perform the swap of capacitors 550a, 550b.

System 500 can implement sequential chopping operations using slow chopping switches 502 and 504 that can be implemented as polarity inversion switches, similar to the switches illustrated in sampling network 536. Chopping switches 502, 504 are switched during a sequential chopping mode to reduce voltage offsets produced as a result of mismatches between sampling capacitors 540a, 540b. Offsets that may be introduced by mismatches in the sampling switches of sampling network 536, or residual offsets produced by the sampling operation could also be reduced through slow chopping of the input section provided by operation of chopping switches 502, 504. Techniques may also be undertaken to reduce tolerance differences between the sampling switches in sampling network 536 to reduce voltage offsets that might be generated during the sampling operation.

Chopping switch 504 is located within the feedback loop that includes the digital feedback from a logic block 506. Logic block 506 takes the digital output of comparator 524 and forms a digital feedback nubit that is used to control the polarity inversion switches in feedback sections 520a, 520b. During sequential chopping operations, digital feedback nubit is modified to account for polarity switching related to sampling network 536. For example, the feedback data provided by digital feedback nubit is inverted for half of the slow chopping period to match the polarity of input sampling network 536, which polarity may be switched during the period of control signal fchop_slow. While in sequential mode, control signal fchop_seq is equal to fchop_slow, as illustrated in FIG. 16b. During sequential chopping, the output data is not inverted as in the case of nested chopping, since the chopping operation does not include the integration capacitors. Control signal fchop_seq controls the switching of chopping switch 504 to demodulate the slow chopped information output from sampling network 536 prior to integration with integrating amplifier 531. When sequential chopping is disabled, control signal fchop_seq is set to a logic 1, meaning that chopping switch 504 is unclocked and not switched.

Nested chopping is more complex than sequential chopping, since nested slow chopping has an impact on integrating capacitors 550a, 550b. The impact on integrating capacitor 550a, 550b is compensated by control logic and phase shifting. Logic block 506 provides a nested chopping operation on the output provided by comparator 524 to demodulate the digital output in a complementary operation to chopping switch 502. During nested chopping, control signal fchop_seq is set to a given state, such as a logic 1, to permit the differential input signals to pass to integrating amplifier 531. In addition, during nested chopping, integrating capacitors 550a, 550b are swapped onto the different polarity signal paths of integrating amplifier 531 to correctly account for the integrated quantization error applied during conversion with slow nested chopping. Switches 560a, 560b, 562a, 562b are switched using control signal fchop_slow to provide the appropriate timing for swapping capacitors 550a, 550b.

In addition, logic block 506 provides feedback control to invert the first bit of digital feedback nubit that occurs after a nested chop clock edge. The feedback compensation provided by logic block 506 during nested chopping preserves the residual voltage value on integrating capacitors 550a, 550b with the appropriate polarity, as well as providing digital feedback with the correct timing and polarity to provide an appropriate error signal for the ΔΣ ADC system 500. Because the nested chopping mode provides for a compensated feedback, residual voltage value voltage offsets resulting from chopping operations can be reduced or eliminated, in addition to the reduction or elimination of offset voltages resulting from tolerance mismatches of sampling capacitors 540a, 540b and sampling network 536.

The timing for control signals fchop_slow and related control signals are illustrated in FIGS. 16a, 16b. In FIG. 16a, a timing signal ccint illustrates the occurrence of systemic noise at the end of a conversion illustrated by the falling edge of fcc1hz. The signal fslow represent a signal from which fchop_slow can be derived, showing a phase relationship where systemic noise caused by ccint is also chopped. In FIG. 16b, a timing signal labeled nestsam illustrates a feedback control that can be used to invert the first feedback bit after a rising edge of control signal fchop_slow. Signal nestsam becomes active at the next sample clock period (ph1) after a rising edge of signal fchop_slow, and stays active for a period of sample clock signal ph1.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. All such modifications and variations are intended to be included herein within the scope of this disclosure and the present invention and protected by the following claims.

What is claimed is:

1. A sigma-delta analog-to-digital converter system comprising:
    a chopped integrator with a first chopping frequency and within a closed loop;
    a modulator coupled to an input of the closed loop for modulating the input to the closed loop at a second chopping frequency, wherein the second chopping frequency being substantially less than the first chopping frequency;
    a demodulator arranged in the forward path of the closed loop after the modulator for demodulating the modulated input at the second chopping frequency; and
    a sampling network in the forward path and outside the closed loop and being disposed between the modulator and demodulator and being responsive to a sampling signal with a frequency greater than the first chopping frequency to sample the input.

2. The system according to claim 1, wherein the system further comprises a differential input to the system whereby the chopped integrator, modulator and demodulator operate on differential signals.

3. The system according to claim 2, wherein the system further comprises:
    a quantizer coupled to the chopped integrator and being operative to provide a feedback signal in the closed loop; and
    a feedback compensation circuit coupled to the quantizer and being operative to control a polarity of the feedback signal for a portion of a chopping interval associated with the second chopping frequency in reference to a polarity of the differential input.

4. The system according to claim 3, wherein the demodulator is arranged outside of the closed loop.

5. The system according to claim 3, wherein the demodulator is arranged within the loop of the closed loop configuration.

6. The system according to claim 5, wherein the feedback compensation circuit further comprises a delay operator being operative to delay a polarity control of the feedback signal until a clock edge associated with the sampling frequency.

7. The system according to claim 5, wherein the system further comprises:
   a storage device in the chopped integrator for storing conversion information associated with a differential signal path; and
   a polarity swapping circuit coupled to the storage device for selectively coupling the storage device to another differential signal path.

8. The system according to claim 7, wherein the polarity swapping circuit is operative to couple the storage device to the another differential path with a complement of a signal having the second frequency.

9. The system according to claim 2, wherein the demodulator follows the chopped integrator in the forward path.

10. The system according to claim 1, wherein the first chopping frequency is less than or equal to the sampling frequency divided by 2N, where $N \geq 1$.

11. The system according to claim 1, wherein the second chopping frequency is less than or equal to ½ the first chopping frequency.

12. The system according to claim 1, wherein the second chopping frequency is about ½ Hz.

13. A method comprising:
   sampling an analog signal with a sampling network at a sampling frequency to obtain a sample signal;
   integrating the sample signal with a chopped integrator operating at a first chopping frequency inside a closed loop;
   modulating the analog signal at a second chopping frequency being substantially lower than the first chopping frequency;
   demodulating the sample signal at the second chopping frequency in a forward path of the closed loop;
   quantizing an output of the chopped integrator to produce a feedback signal in the closed loop; and
   controlling a polarity of the feedback signal for a portion of a chopping interval associated with the second chopping frequency in reference to a polarity of the sample signal.

14. The method according to claim 13, wherein the method further comprises demodulating outside of the loop of the closed loop configuration.

15. The method according to claim 13, wherein the method further comprises modulating and demodulating around the sampling network.

16. The method according to claim 15, wherein the method further comprises demodulating inside the closed loop.

17. The method according to claim 16, wherein the method further comprises delaying inverting the polarity of the feedback signal until a clock edge associated with the sampling frequency.

18. The method according to claim 16, wherein the method further comprises:
   storing integrator conversion information associated with a differential signal path; and
   selectively coupling the stored integrator conversion information with another differential signal path.

19. The method according to claim 18, wherein the method further comprises selectively coupling the stored integrator conversion information with the another differential signal path using a complement of the second chopping frequency.

20. The method according to claim 13, wherein the method further comprises arranging the sampling frequency to be greater than the first chopping frequency.

21. The method according to claim 20, wherein the first chopping frequency is less than or equal to the sampling frequency divided by 2N, where $N \geq 1$.

22. The method according to claim 13, wherein the second chopping frequency is less than or equal to ½ the first chopping frequency.

23. The method according to claim 13, wherein the second chopping frequency is about ½ Hz.

24. The method according to claim 13, wherein the method further comprises controlling a feedback signal in the closed loop configuration to maintain an appropriate frequency location and polarity in a forward path of the closed loop configuration.

25. A method for converting an analog signal to a digital signal using a $\Delta\Sigma$ analog to digital converter, the method comprising:
   sampling the analog signal with a sampling network at a sampling frequency to obtain a sample signal;
   integrating the sample signal with an integrator operating inside a loop of a closed loop configuration;
   shifting residual offsets associated with the sampling network to an offset frequency using a chopping operation operating at a first chopping frequency being substantially less than the sampling frequency; and
   compensating a polarity of a feedback signal in the closed loop configuration to maintain an appropriate frequency location and polarity in a forward path of the closed loop configuration.

26. The method according to claim 25, wherein the method further comprises arranging the first chopping frequency to be less than the sampling frequency divided by 2N, where $N \geq 1$.

27. The method according to claim 25, wherein the method further comprises chopping the integrator within the loop at a second chopping frequency greater than the first chopping frequency and less than the sampling frequency.

28. The method according to claim 25, wherein the method further comprises:
   quantizing an output of the integrator to obtain a feedback signal in the closed loop configuration; and
   controlling a polarity of the feedback signal for a portion of a chopping interval associated with the first chopping frequency in reference to a polarity of the sample signal.

29. The method according to claim 28, wherein the method further comprises delaying controlling the polarity of the feedback signal until a clock edge associated with the sampling frequency.

30. The method according to claim 25, wherein the method further comprises:
   storing integrator conversion information associated with a differential signal path; and
   selectively coupling the stored integrator conversion information with another differential signal path.

31. The method according to claim 30, wherein the method further comprises selectively coupling the stored integrator conversion information with the another differential signal path using a complement of a signal having the first chopping frequency.

32. A system for converting an analog signal to a digital signal using a $\Delta\Sigma$ analog to digital converter, the system comprising:
   a sampling network coupled to the analog signal and being responsive to a sampling signal operable at a sampling frequency to obtain a sample signal;
   an integrator arranged inside a loop of a closed loop configuration and being coupled to the sampling network to receive the sample signal;

a polarity switching element coupled to an input of the sampling network and being responsive to a first chopping signal operable at a first frequency to change a polarity of the analog signal, the first frequency being substantially less than the sampling frequency; and a compensation element coupled to a feedback path in the closed loop configuration and being operable to control a polarity of a feedback signal in the feedback path in reference to the polarity of the analog signal coupled to the sampling network.

33. The system according to claim 32, wherein the first frequency is less than the sampling frequency divided by 2N, where N≧1.

34. The system according to claim 32, wherein the integrator further comprises a chopped integrator that includes chopping elements within the loop and being responsive to a second chopping signal operable at a second frequency greater than the first frequency and less than the sampling frequency.

35. The system according to claim 32, wherein the compensation element further comprises a delay element being operable to delay a polarity control of the feedback signal until a predetermined point in a cycle of the sampling signal.

36. The system according to claim 32, wherein the system further comprises:

an integrator storage element coupled to the integrator for storing integrator conversion information associated with a differential signal path; and a switching mechanism coupled to the integrator storage element for selectively coupling the stored integrator conversion information with another differential signal path.

37. The system according to claim 36, wherein the switching mechanism is responsive to a complement of the first chopping signal to selectively couple the stored integrator conversion information with the another differential signal path.

* * * * *